United States Patent
Kotowski et al.

(12)
(10) Patent No.: US 6,888,765 B1
(45) Date of Patent: May 3, 2005

(54) INTEGRATED CIRCUIT AND METHOD FOR TESTING SAME USING SINGLE PIN TO CONTROL TEST MODE AND NORMAL MODE OPERATION

(75) Inventors: Jeffrey P. Kotowski, Nevada City, CA (US); Kyle Fodchuk, Nevada City, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/067,441

(22) Filed: Feb. 4, 2002

(51) Int. Cl.[7] .................. G06F 13/00; H03K 19/0175
(52) U.S. Cl. .................. 365/201; 365/189.03; 326/59
(58) Field of Search .................. 365/201, 189.03; 714/744, 733; 326/59, 60

(56) References Cited

U.S. PATENT DOCUMENTS

| | | | | |
|---|---|---|---|---|
| 4,291,221 A | * | 9/1981 | Muehlbauer et al. | 377/44 |
| 5,557,571 A | * | 9/1996 | Kato | 365/189.05 |
| 6,289,055 B1 | * | 9/2001 | Knotz | 375/286 |
| 6,400,605 B1 | * | 6/2002 | Adkins | 365/185.18 |
| 2002/0097616 A1 | * | 7/2002 | Schneider et al. | 365/200 |

FOREIGN PATENT DOCUMENTS

JP          02188836 A  *  7/1990  ........... G06F/11/22

* cited by examiner

Primary Examiner—Richard Elms
Assistant Examiner—J. H. Hur
(74) Attorney, Agent, or Firm—Girard & Equitz LLP

(57) ABSTRACT

An integrated circuit including operational circuitry operable in response to at least one control signal asserted to an external node from an external source, and test circuitry coupled to the external node and the operational circuitry. In response to data asserted to the external node from an external source, the test circuitry enters a test mode in which it tests, configures, or reconfigures the operational circuitry. The test circuitry also asserts to the operational circuitry each control signal received at the external node (or an amplified or translated version thereof). Other aspects of the invention include test circuitry for use in a circuit having an access node and methods for performing on-chip testing, configuration, and control of operational circuitry within a chip in response to test data and at least one control signal asserted from an external source to an external node.

44 Claims, 13 Drawing Sheets

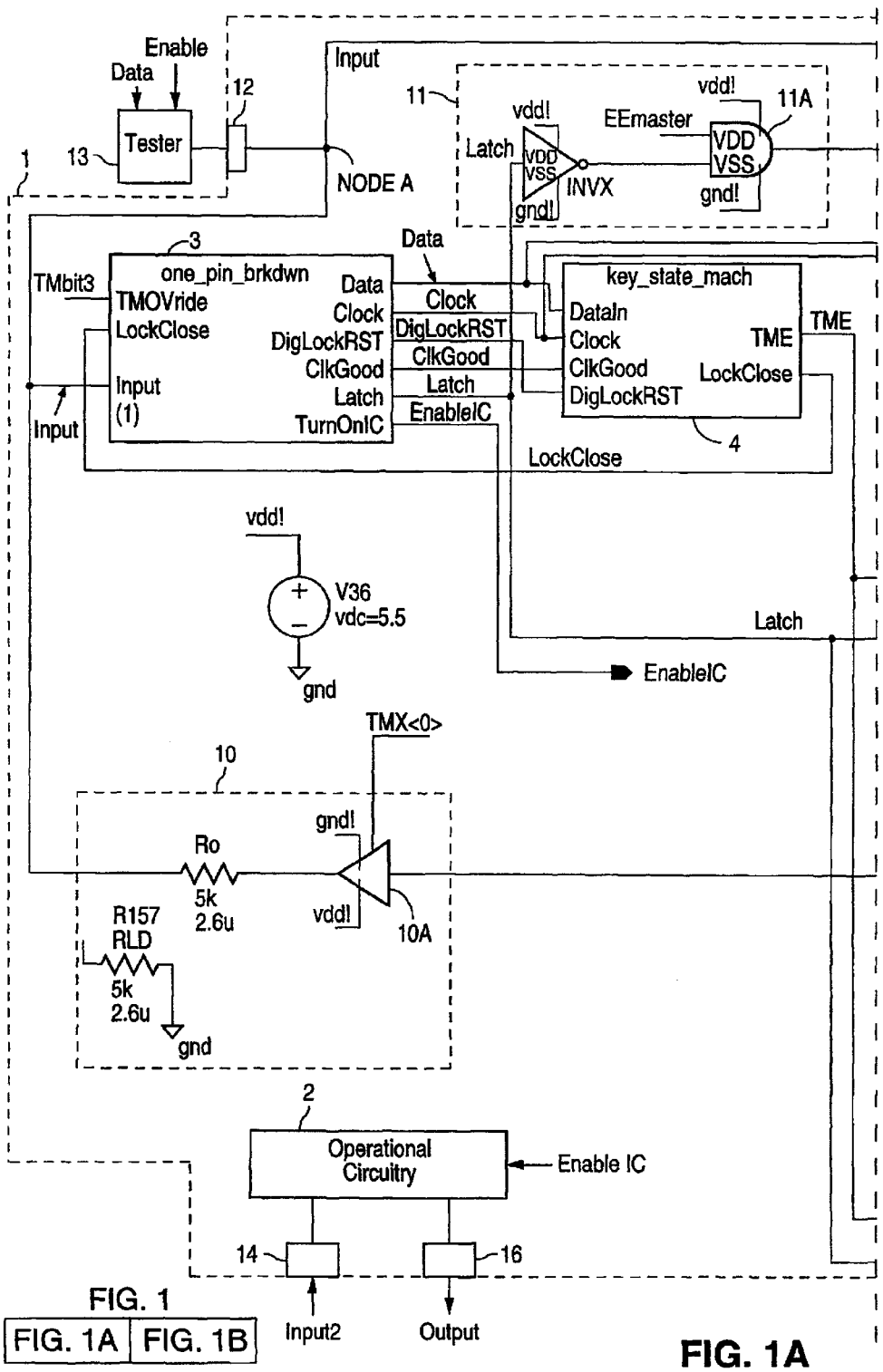

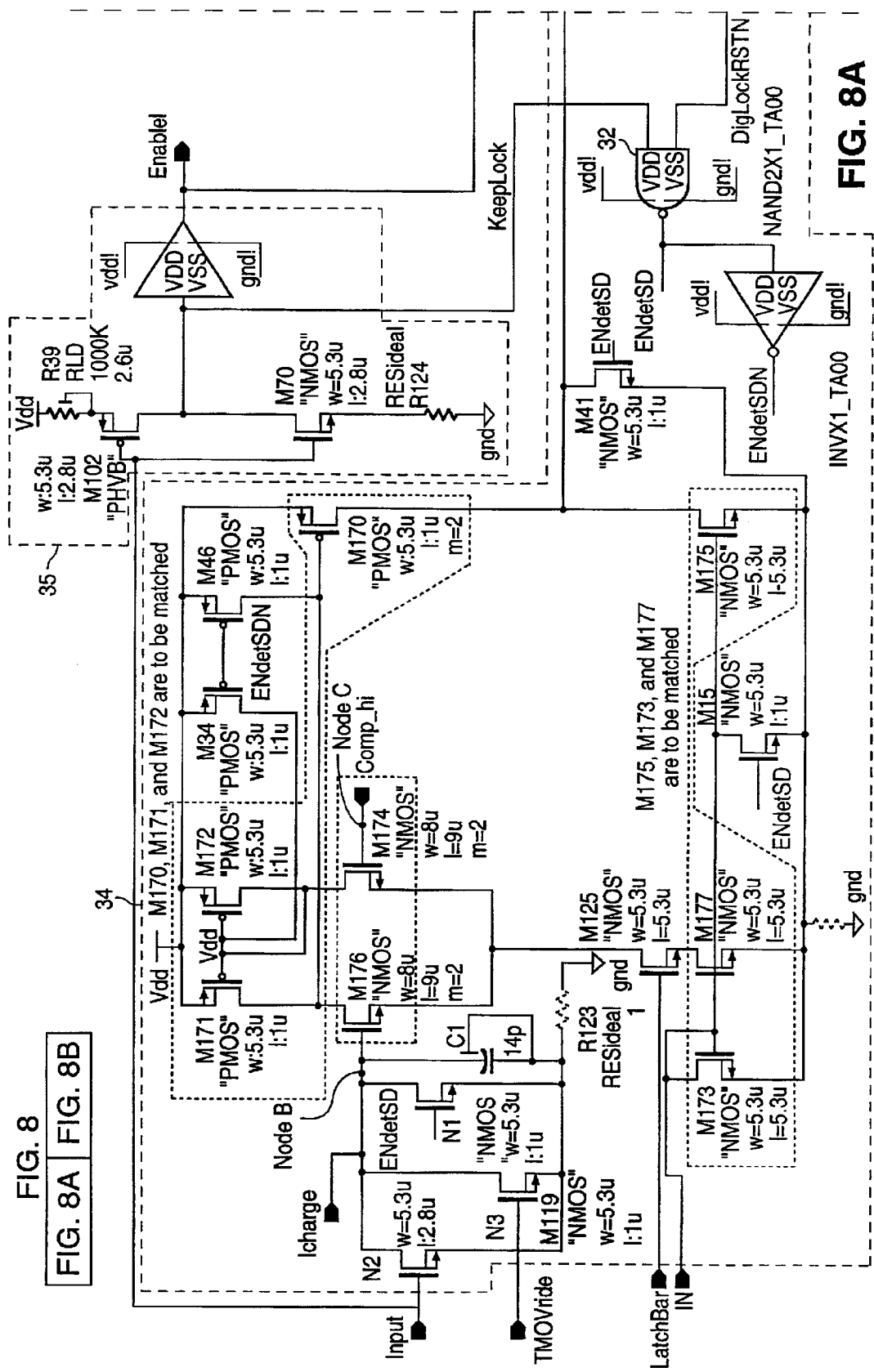

INTEGRATED CIRCUIT AND METHOD FOR TESTING SAME USING SINGLE PIN TO CONTROL TEST MODE AND NORMAL MODE OPERATION

BACKGROUND OF THE INVENTION

1. Field of the Invention

The present invention relates to integrated circuits including test mode circuitry and methods for testing such integrated circuits. More specifically, the inventive method is a method for testing an integrated circuit ("chip") in which test data are sent to or from (or both to and from) the chip via one pin, the pin is also used in a normal operating mode to assert at least one signal to or from the chip, and the pin is optionally also used in a third mode (or in the test mode) for sending signals to circuitry of the chip for trimming or reconfiguring the chip.

2. Description of the Related Art

The quest to produce integrated circuits that operate with higher accuracy has led to a need for testing and final adjustment (e.g., at the manufacturing facility) of the performance of manufactured chips. Various methods have been used to improve performance of chips after they have been manufactured, including various trimming techniques that are well known in the art (such as those using laser or current trimmable resistors or zener zapping). However, prior art trimming techniques are traditionally very expensive to implement and add to the cost of the electronic system.

Also, some chips are designed to be reconfigurable to perform selected ones of multiple analog or digital (or analog and digital) functions. Such chips are useful for a range of applications, but must be designed to receive signals which can reconfigure them into different modes of operation.

To reduce the cost and complexity of chips that can be reconfigured, or tested and trimmed (or otherwise modified) after manufacture, the inventors have recognized that it would be desirable to configure them with a reduced number of pins. In accordance with the present invention, one external node of a chip (to which a single pin can be connected) is used for different purposes in different operating modes of the chip. In a test mode of the chip, test data (e.g., data for use in testing, trimming or reconfiguring the chip, or resulting from such testing, trimming or reconfiguration) are sent to or from (or both to and from) the chip via the external node. The same external node is also used in a normal operating mode of the chip, by asserting at least one signal (e.g., an enable signal) to the external node from a device external to the chip.

Throughout this disclosure, including in the claims, the expression "test mode" operation of a chip is used in a broad sense to denote an operation in which circuitry of the chip is trimmed (or otherwise configured or reconfigured) or tested. Throughout the specification (including in the claims), the expression "test data" is used in a broad sense to denote a signal (or signals) asserted to a chip to trigger (or accomplish) test mode operation of the chip, or a signal (or signals) asserted by the chip (to an external device) during test mode operation. Examples of test data include a stream of binary data (that selects one of a number of different test modes), a high voltage (for programming an EEPROM) during a test mode, a stream of binary data indicative of at least one characteristic of the chip measured during a test mode, and an analog signal indicative of at least one characteristic of the chip measured during a test mode.

Throughout this disclosure, including in the claims, the expression "external node" (or "external node") denotes a node of a chip at which a conductor (e.g., an input pin, output pin, or input/output pin) can be connected so that a signal can be asserted from an external device via the conductor to the external node (or from internal circuitry of the chip to an external device, via the external node and the conductor) during operation of the chip. For example, Node A of FIG. 1 is an external node. The expression "internal node" denotes a node of a chip that is not an external node.

SUMMARY OF THE INVENTION

In a class of embodiments, the invention is an integrated circuit ("chip") including an external node (and typically also additional external nodes), operational circuitry configured to operate in response to at least one control signal (e.g., an enable signal) determined by a signal asserted to the external node from an external source, and test circuitry coupled to the external node and the operational circuitry. The operational circuitry can be analog or digital circuitry or mixed analog and digital circuitry. During test mode operation of the test circuitry (which can but need not coincide with test mode operation of the operational circuitry), the test circuitry can test, configure, or reconfigure the operational circuitry in response to test data asserted to the external node from an external source. The test circuitry also asserts to the operational circuitry each control signal received at the external node (or an amplified or translated version of each such control signal). Preferred embodiments of the test circuitry are configured to assert (during test mode operation) test data (e.g., the results of test measurements) to the external node for transmission to external circuitry. Preferably, the test circuitry includes logic circuitry coupled to the external node for receiving an input signal from an external source, and the logic circuitry is configured to extract the test data (and preferably also a clock) from the input signal. The logic circuitry is configured to pass through the input signal or an amplified or translated version thereof (as a control signal) to the operational circuitry or to extract each control signal from the input signal.

Typically, the test data asserted from an external device to the inventive chip is serial data used for controlling the enabling, disabling, and operational modes of synchronous circuitry responsible for on-chip configuration, control and testing, and such test data is indicative of at least one clock signal.

Other aspects of the invention include test circuitry suitable for use in a circuit having an access node and operational circuitry configured to operate in response to at least one control signal (e.g., an enable signal) determined by a signal asserted to the access node, and methods for performing on-chip testing (or configuration or reconfiguration) and control of operational circuitry within a chip in response to test data and at least one control signal asserted from an external source to one external node of the chip.

In preferred embodiments, the inventive test circuitry includes all or some of the following safety features for preventing accidental entry into test mode operation in response to an input signal received at an external node: a timeout circuit that disables test mode operation unless test data are asserted to the external node with at least a minimum frequency (e.g., 100 kHz); lock circuitry (e.g., a state machine) which must receive and recognize a digital key (i.e., data indicative of a key) to enable test mode operation; circuitry that establishes a limited "lock open" time window (e.g., 100 microseconds) commencing on receipt of an initial test data bit, in which the test circuitry must receive a valid digital key in order to initiate test mode operation; lock circuitry that allows only one key assertion attempt (and preferably, if an incorrect key bit is entered, closes the "lock open" time window); lock circuitry that remains closed (in a state in which it does not respond to data asserted at the external node) for a minimum rest time before it can be placed in a receptive state (sometimes referred to herein as a "begin" state) in which it analyzes key bits asserted to the external node (e.g., the external node must be held low for a minimum time, such as 100 microseconds, before a transition (or other predetermined data structure) of the input signal can place the lock circuitry in the receptive state).

In preferred embodiments, the test circuitry is configured to extract test data and a clock, and preferably also a latch signal, from an amplitude-modulated input signal asserted to an external node. The test circuitry is also configured to pass through the input signal or an amplified or translated version of the input signal (for use as a control signal, e.g., as a binary Enable signal), or to extract a control signal from the input signal. Typically, the input signal is initially tri-stated to an intermediate potential and then driven to levels above and below the intermediate potential, and the test circuitry is configured to extract (from the input signal) the data, the clock, and the latch signal by distinguishing between four voltage levels of the input signal: a low level (below a "low" threshold potential) is interpreted as a "zero" data bit (if level changes of the input signal have occurred with at least a minimum frequency); an intermediate level (between the low threshold potential and a "high" threshold potential) is interpreted as no test data bit (neither a "zero" bit nor a "one" bit); a high level between the high threshold potential and a greater "latch threshold" potential) is interpreted as a "one" data bit (if level changes of the input signal have occurred with at least a minimum frequency); and a latch level (above the latch threshold potential) is interpreted as a latch signal (in response to which at least one previously received test data bit is captured in at least one register of the test circuitry). The test circuitry ceases extraction of test data from the input signal if the input signal level has not changed for a predetermined minimum time or has changed during such time but with less than a predetermined minimum frequency. In preferred embodiments, following the leading edge of a latch signal, the input signal level rises (without falling below the latch threshold potential) to a high programming voltage (for programming an EEPROM or other nonvolatile memory of the test circuitry with at least one previously received test data bit) and then falls (preferably gradually) to below the latch threshold potential.

In preferred embodiments, when the test circuitry is neither in the test mode nor in a receptive mode in which it analyzes test data bits to determine whether they are indicative of a digital key, the test circuitry automatically enters a state of reduced power consumption.

DETAILED DESCRIPTION OF THE PREFERRED EMBODIMENTS

A preferred embodiment of the invention will be described with reference to FIGS. 1 and 6–13. Signals generated during operation of this embodiment of the invention will be discussed with reference to FIGS. 2–5.

Figure 1B:
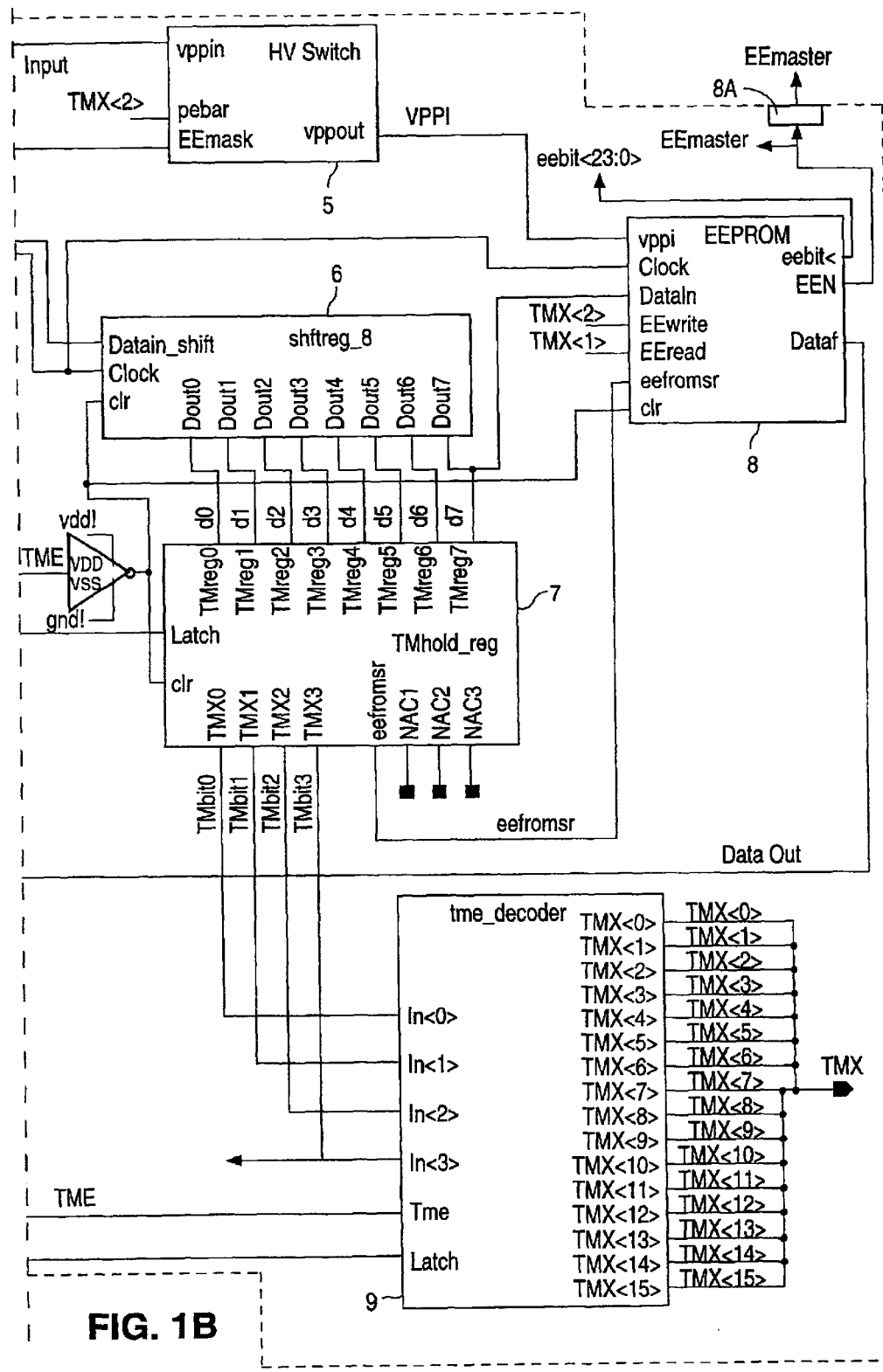
FIG. 1 (comprising FIGS. 1A and 1B) is a simplified schematic diagram of an integrated circuit that embodies the invention, with an external test circuit (13).

Integrated circuit 1 ("chip" 1) of FIG. 1 includes operational circuitry 2, and test mode circuitry comprising input logic 3, state machine 4, high voltage switch 5, shift register circuitry 6, register 7, EEPROM 8, decoder 9, and output buffer circuitry 10, connected as shown in FIG. 1. Pad 12 of chip 1 (at Node A, an external node of chip 1) is connected to external test circuit 13 (e.g., by a wire between pad 12 and circuit 13) during operation of chip 1. Circuit 13 asserts a modulated Enable signal (labeled "Input") to pad 12, and receives output test data (from EEPROM 8, and labeled "Data Out" in FIG. 1) that is asserted via buffer circuitry 10 to pad 12. Operational circuitry 2 can include digital circuitry, analog circuitry or both. In a normal operating mode, operational circuitry 2 generates at least one output signal (the signal labeled "Output" asserted at pad 16) in response to at least one input signal (the signal labeled "Input2" asserted from external circuitry to pad 14). In a test mode of chip 1, the test circuitry functions to test or configure operational circuitry 2 (or other circuitry of chip 2). Preferably, the test circuitry is operable in any selected one of a number of test modes. Operational circuitry 2 generates an output signal in response to the input signal "Input2" in some such test modes but does not necessarily do so in all of the test modes.

Logic 3 is configured to demodulate the modulated enable signal ("Input") to extract binary data (labeled "Data") and a binary Latch signal ("Latch") therefrom, to generate a clock signal (labeled "Clock") from the data Logic 3 is also configured to pass through an amplified version of the Input signal as a binary Enable signal (labeled "EnableIC"), although in alternative implementations, logic 3 is configured to pass through the Input signal as the EnableIC (without amplifying or translating it) or to extract the EnableIC signal from the Input signal. Logic 3 is also configured to generate signals "CLKGood" and "DigLockRST" (to be described below) from the Data and EnableIC signal.

Logic circuitry 3 asserts the EnableIC signal to operational circuitry 2. In each operating mode of chip 1, the level of the EnableIC signal is determined by the level of the Input signal, and circuitry 2 is enabled or disabled depending on the level of the Input signal. Typically, circuitry 2 is enabled by a high level of the EnableIC signal.

The Data extracted from the Input signal (the modulated enable signal) can include at least one of configuration data (that can be used to program EEPROM 8, for example to trim or improve chip 1 after it has been packaged) and test data (that can be used to implement test mode operation of chip 1).

The cells of EEPROM (electrically erasable programmable read-only memory) 8 can be erased and reprogrammed (in a manner to be described below) in response to the data asserted at the output of shift register 6 (which data has been extracted from the Input signal), the output of high voltage switch 5, signals output from state machine 4, register 7, and decoder 9, and the clock signal generated in logic circuitry 3.

In a preferred class of implementations, the digital circuitry of chip 1 of FIG. 1 is implemented with NMOS and PMOS transistors, and its supply voltage (Vdd-Ground) has a conventional value (e.g., 5 volts). All transistors of chip 1 that are coupled to receive the "Input" signal should be high voltage transistors in the typical implementations in which the level of the Input signal can exceed 5 volts.

Figure 2:
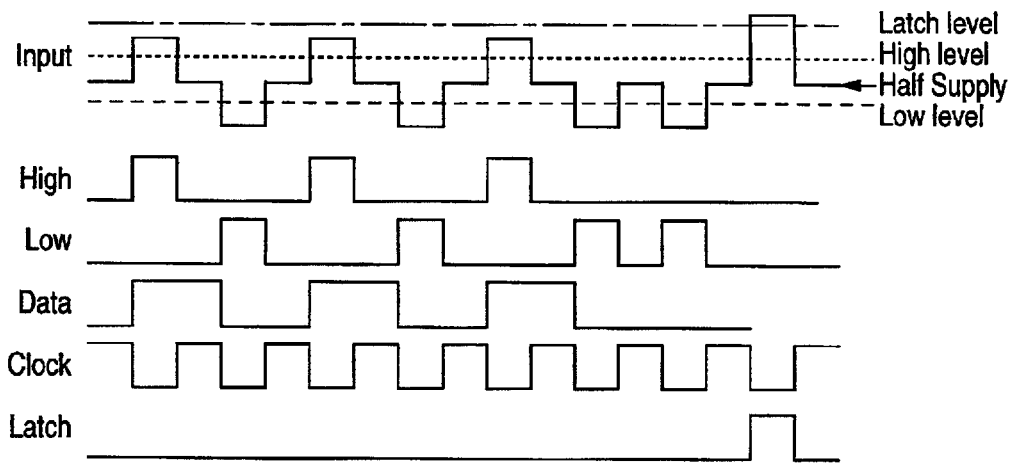
FIG. 2 is a timing diagram showing waveforms of some of the signals asserted to and generated by the test circuitry of FIG. 1.
Figure 3:
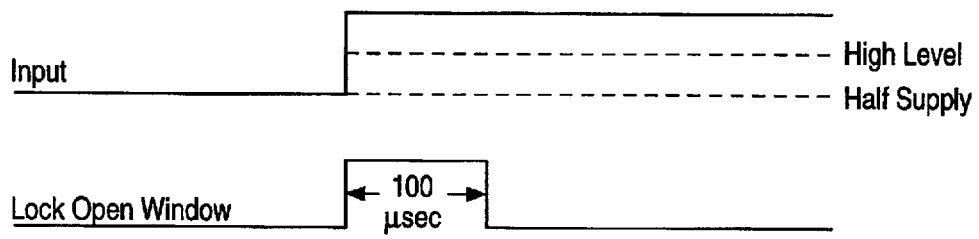
FIG. 3 is a timing diagram showing waveforms of some of the signals asserted to and generated by the test circuitry of FIG. 1.

FIG. 2 shows waveforms of some of the signals asserted to and generated by the test circuitry of FIG. 1. The "Input" signal of FIG. 2 is an amplitude modulated signal that is asserted by external circuit 13 to pad 12 (at Node A of chip 1) and received by logic circuitry 3. To assert the Input signal, circuit 13 tri-states pad 12 to an intermediate potential (typically equal to half the supply potential, i.e. "Vdd/2" above ground), and drives pad 12 above and below this intermediate potential. As noted above, the Input signal is indicative of an Enable signal (the "EnableIC" signal of FIG. 1), binary data ("Data"), a Latch signal, and a clock ("Clock"). Logic circuitry 3 is configured to demodulate the Input signal to extract the Enable signal, data, and Latch signal therefrom, by distinguishing between four voltage levels of the Input signal: a low level (between ground potential for logic circuitry 3 and a "low" threshold potential above ground potential); an intermediate level (between the low threshold potential and a "high" threshold potential that is greater than the low threshold potential); a high level (between the high threshold potential and a latch threshold potential that is greater than the high threshold potential); and a latch level (above the latch threshold potential). Typically, the Input signal is generated so that the latch threshold potential is set to be significantly higher than the logic circuitry 3's supply potential (e.g., the latch threshold potential can be (Vdd+2) volt above ground, where "Vdd" is the supply potential), the midpoint between the high threshold potential and the low threshold potential is set to be half the supply potential ("Vdd/2" above ground), the high threshold potential is (¾)Vdd, and the low threshold potential is (¼)Vdd.

Test circuit 13 can generate an Input signal of the type shown in FIG. 2 by multiplying a Clock signal (having the waveform shown in FIG. 2) by a Data signal (having the waveform shown in FIG. 2) that is 90 degrees out of phase with the Clock signal. The FIG. 6 embodiment of test circuit 13 functions in this way. The FIG. 6 embodiment of test circuit 13 includes multiplexer 122, tristate buffer 123, resistor divider 124, switch 125, and logic 126, connected as shown. Multiplexer 122 is controlled to pass a selected one of an Enable signal or a Data signal to the input of buffer 123, and buffer 123 also receives a Clock signal having the appropriate relative phase. To assert (to pad 12) the Input signal (modulated to be indicative of the Enable or Data signal) produced at the output of buffer 123, switch 125 is placed in the state shown in FIG. 6. In a mode in which test circuit 13 recovers data (identified as "Data Out" in FIG. 1) asserted by output buffer 10 (of chip 1) via pad 12 to test circuit 13, switch 125 is placed in a state that couples pad 12 to logic 126, and logic 126 extracts the data from the modulated output of output buffer 10.

In typical implementations, in order for the Input signal to trigger a test mode of chip 1, test circuit 13 must initially assert the Input signal with its amplitude held low for more than a predetermined minimum time (e.g., 100 microseconds) before asserting a modulated Input signal indicative of data. In a typical implementation of FIG. 1, the width of each pulse of the "High" signal and the "Low" signal of FIG. 2 is 5 microseconds, and the frequency of the Clock signal of FIG. 2 is 100 kHz.

In order for logic circuitry 3 to extract binary data from the Input signal, the binary data must have a frequency not less than a predetermined minimum frequency $F_{min}$ ($F_{min}$= 100 kHz in a typical implementation of FIG. 1). If a minimum time interval $T_{shutdown}=N/F_{min}$ (where N is an integer) elapses without the Input signal being modulated with data (or alternatively, unless the Input signal is modulated in some sense with data having frequency greater than or equal to the minimum frequency), then logic circuitry 3 will not extract data from the Input signal (and preferably, the data extraction circuitry thereof will be shut down to conserve power) and will instead monitor the Input signal to extract therefrom one or both of a binary Enable signal (labeled "EnableIC" in FIG. 1) and a binary Latch signal (labeled "Latch" in FIG. 1).

Figure 7A:
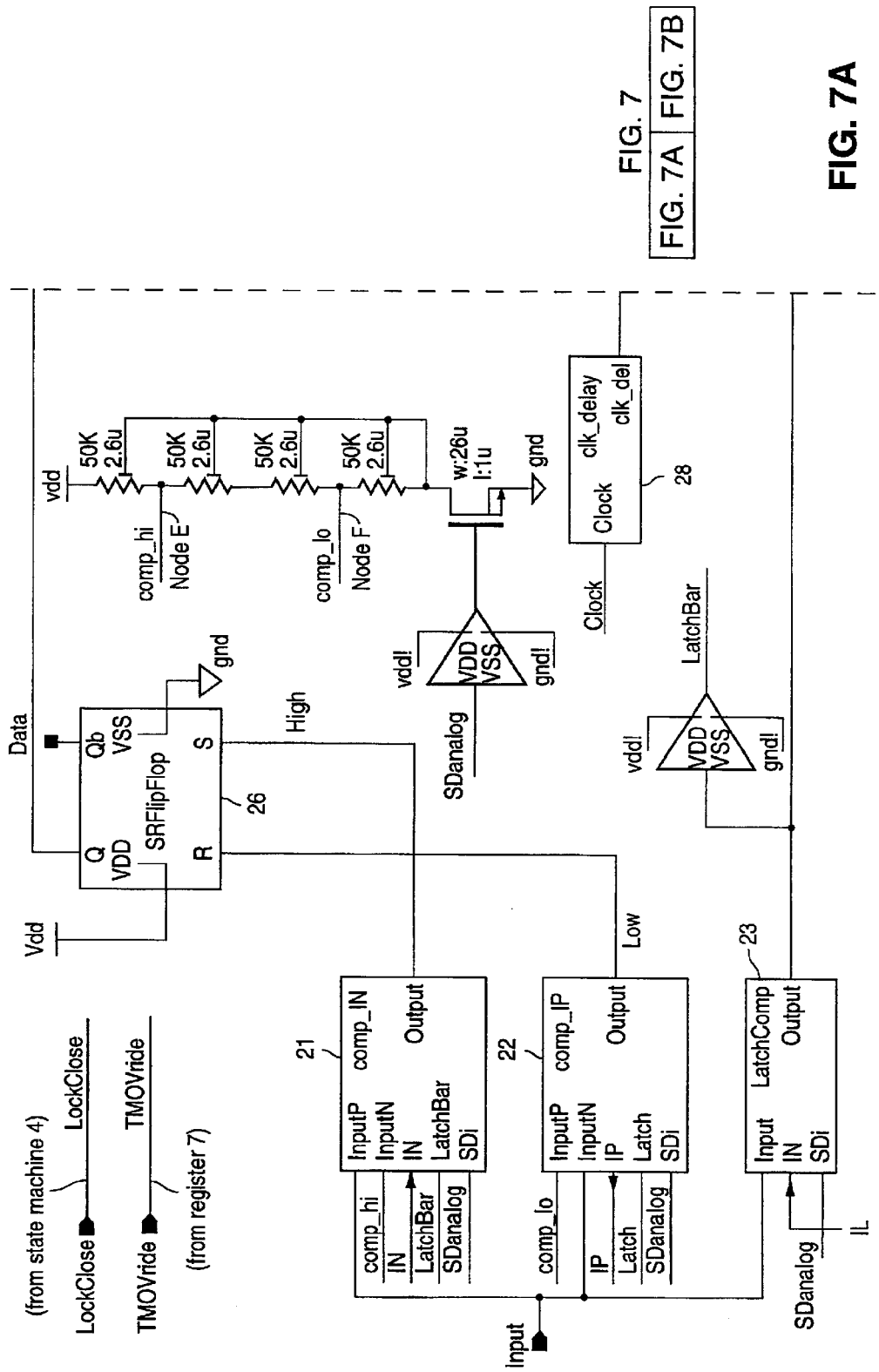
FIG. 7 (comprising FIGS. 7A and 7B) is a schematic diagram of an embodiment of logic circuitry 3 of FIG. 1.
Figure 7B:
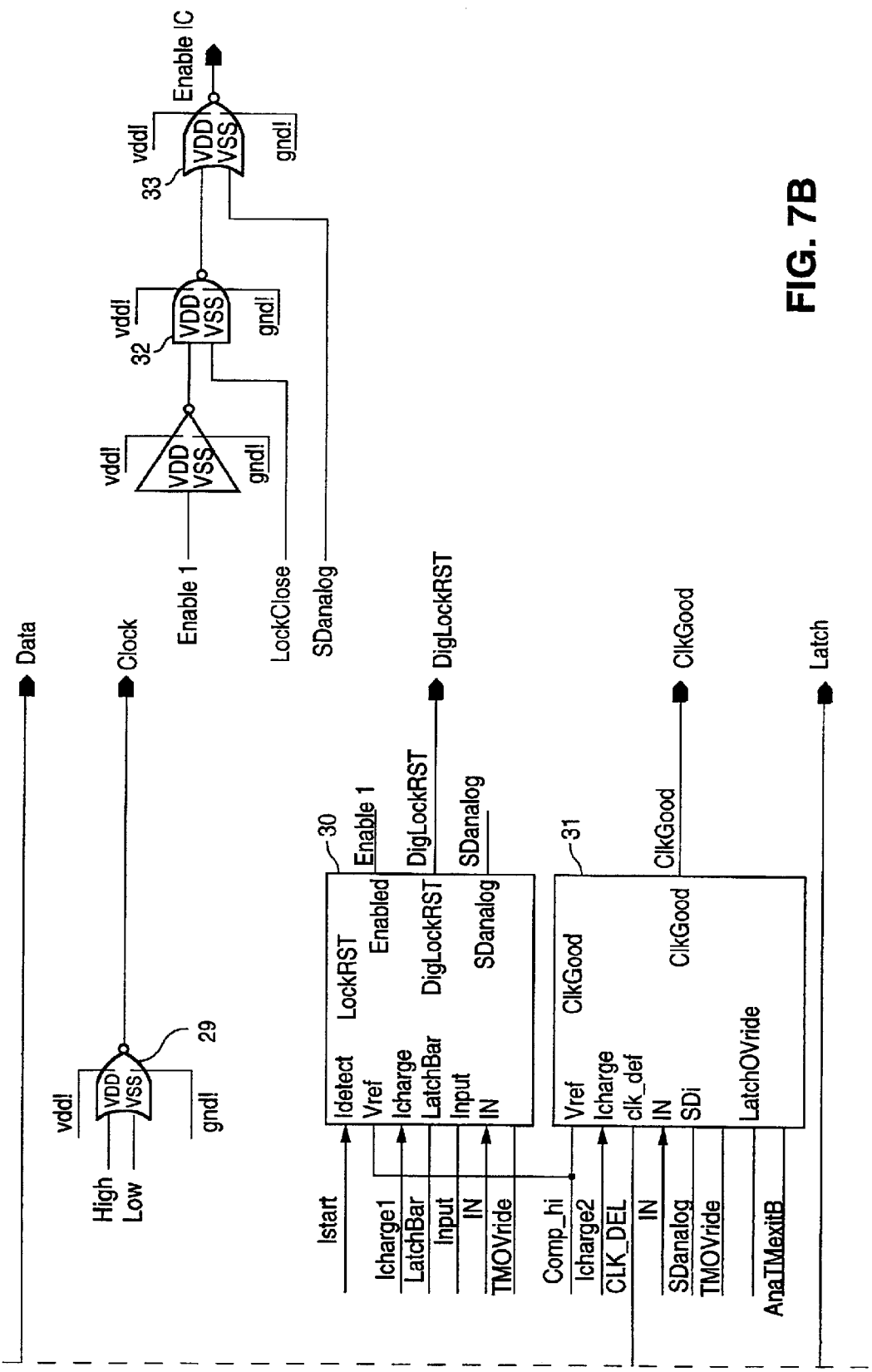

FIG. 7 is a schematic diagram of an embodiment of logic circuitry 3 of FIG. 1. As shown in FIG. 7 the Input signal (having a waveform such as that shown in FIG. 2) is asserted to an input of each of comparators 21, 22, and 23. The "High" signal (having waveform shown in FIG. 2) asserted at the output of comparator 21 as a result of comparing the Input signal with the above-mentioned "high" threshold potential (identified as "comp_hi" in FIG. 7) is asserted to the "Set" terminal of flip-flop 26. The "Low" signal (having waveform shown in FIG. 2) asserted at the output of comparator 21 as a result of comparing the Input signal with the above-mentioned "low" threshold potential (identified as "comp_lo" in FIG. 7, and generated at Node F of FIG. 7) is asserted to the "Reset" terminal of flip-flop 26. When the "High" signal has a high level (indicative of a logical one), the Input signal is considered to be indicative of a binary "one" bit, and when the "Low" signal has a high level (indicative of a logical one), the Input signal is considered to be indicative of a binary "zero" bit. The "Data" signal (having waveform shown in FIG. 2) asserted in response at the output of flip-flop 26 is thus indicative of the binary data bits determined by the Input signal, and is asserted to the data input of state machine 4 (of FIG. 1) and to the input of shift register 6.

The "Latch" signal (having waveform shown in FIG. 2) is asserted at the output of comparator 23 as a result of comparing the Input signal with the above-mentioned "latch" threshold potential (identified as "IL" in FIG. 7). In a preferred implementation, the latch threshold potential is at least approximately equal to (Vdd+2) volt above ground, and each latch pulse of the Input signal asserted by tester 13 has amplitude greater than the latch threshold potential. Some implementations of comparator 23 employ a CMOS device to extract the latch pulses from the Input signal. The CMOS device is coupled and configured to turn on when the Input signal is 2(Vth) volts above the supply potential Vdd, where Vth is the threshold voltage of the CMOS device and is roughly equal to one volt. The "Latch" signal at the output of comparator 23 is asserted to register 7, decoder 9, and circuit 11 (of FIG. 1), and to circuitry within logic 3.

Shift register 6 includes eight flip-flops coupled to shift through a sequence of bits of the Data signal (from logic circuitry 3) from register 6's input to its output, in response to the Clock signal. Register 7 includes eight flip-flops, each having an input coupled to receive a bit from a different one of the flip-flops in register 6. In response to a high level of the "Latch" signal, register 7 captures the last eight bits received by register 6. Register 7 asserts four of the captured bits (the last four bits received by register 6, identified as bits TMbit0, TMbit1, ThMbit2, and TMbit3 in FIG. 1) in parallel to decoder 9. Also in response to a high level of the "Latch" signal, this four-bit word is captured by decoder 9. In response to the captured four-bit word, decoder 9 asserts a 16-bit control word, "TMX<0:15>." This 16-bit control word (or a subset of the bits thereof) determines a test mode of operation of chip 1, and is used to control circuitry for implementing such mode. In some such test modes (and configuration modes), the "Tmbit3" captured in register 7 is asserted (as the "TMOVride" signal discussed below) to circuit 31 (of logic circuitry 3) with a level that prevents assertion of a low level of the "CLKGood" signal, so that tester 13 has sufficient time to make measurements (especially, analog voltage measurements) or perform a configuration operation before logic circuitry 3 concludes that the test mode has ended. When tester 13 desires to end the test mode, it must cause another set of eight Data bits to be latched into register 7 (to initiate another test or configuration mode) or it must cause the Input signal to terminate the test mode.

Typically, the data asserted (to pad 12) by test circuit 13 in a test mode has the following format: a sequence of eight test mode register bits, "Tmbit<7:0>" (to be latched into register 7), followed by a sequence of twenty-four EEPROM data bits (to be shifted from register 6 into EEPROM 8).

Figure 13:
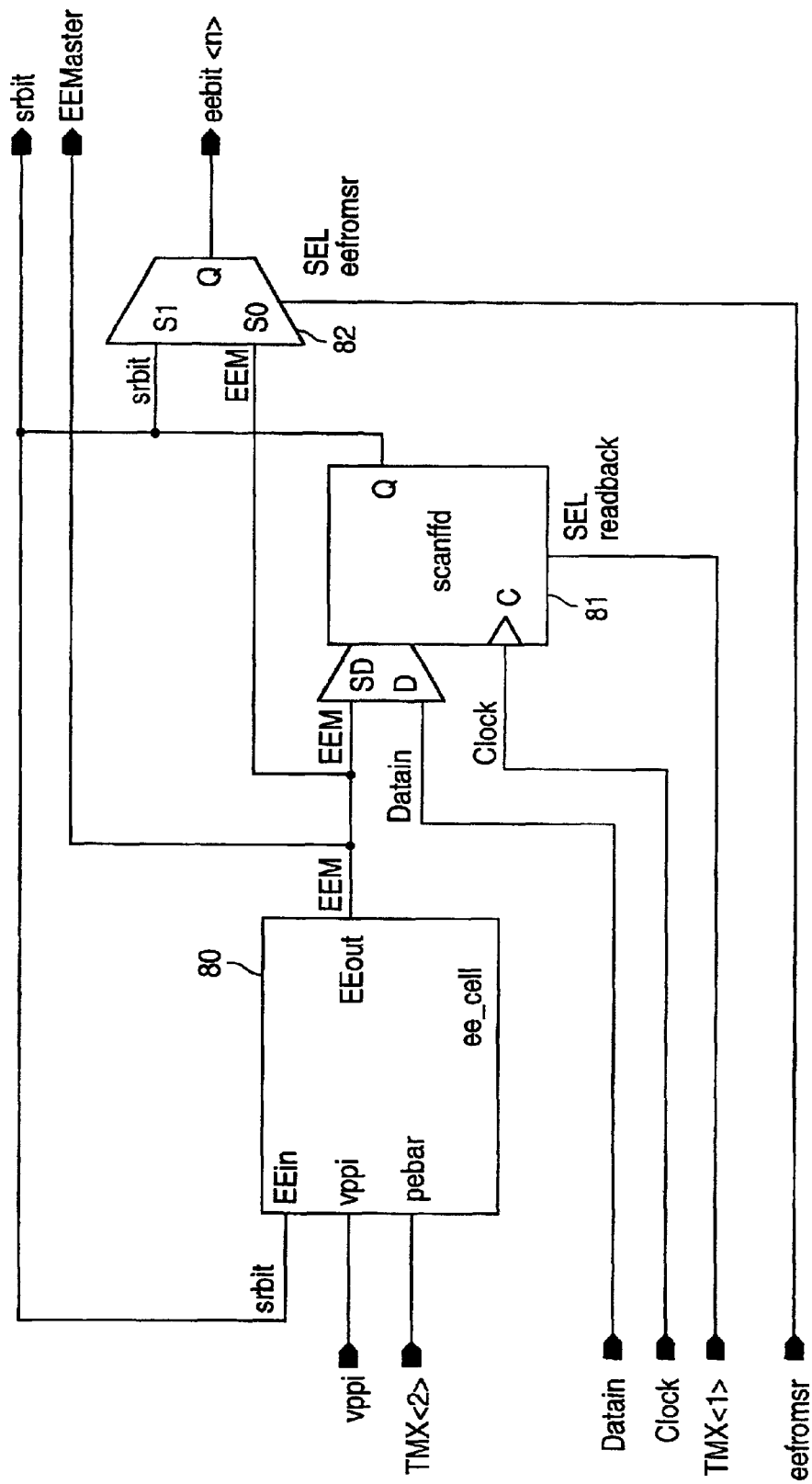
FIG. 13 is a schematic diagram of an implementation of a cell that can be included in EEPROM 8 of FIG. 1.

Register 7 asserts to EEPROM 8 another one (identified as bit "eefromsr" in FIG. 1) of each set of eight bits that it captures, to cause each cell of EEPROM 8 to assert (as one of the bits "eebit<23:0>" indicated in FIG. 1) either the data bit present at the cell's data input (typically, this is a bit asserted from register 7 to EEPROM 8) or the data bit stored in such cell. One bit output from decoder 9 (bit TMX<2>) is asserted to each cell of EEPROM 8 to place the cell in a state in which it can store a bit from register 7. Another bit output from decoder 9 (bit TMX<1>) is asserted to each cell of EEPROM 8 (i.e., to circuit 81 of each cell as shown in FIG. 13) to control whether the data bit present at the cell's data input (typically, this is a bit asserted from register 7 to EEPROM 8), or the data bit stored in such cell, is asserted at the cell's "srbit" output (the "srbit" output of the last cell of EEPROM 8 is the "Data Out" of FIG. 1). Thus, EEPROM 8 can operate in a variety of modes in response to bits "TMX<1>" and "eefromsr" (and the Clock signal from logic circuitry 3), including a mode in which EEPROM 8 passes a sequence of bits from register 6 through each of its cells to its "Data Out" output.

In a preferred implementation of the FIG. 1 circuit, EEPROM 8 comprises twenty-four cells (each with associated logic circuitry) having the structure shown in FIG. 13 (or a slightly modified version thereof, to be described below). The cells are connected in series, with the "Datain" input of the first cell coupled to the output of shift register 6 as shown in FIG. 1, the "srbit" output of each of the first twenty-three cells being coupled to the "Datain" input of the next cell in the series, and the "srbit" output of the last cell in the series being the "Data Out" signal shown in FIG. 1. Data written into EEPROM 8 can be used to trim or otherwise modify circuitry of chip 1 after chip 1 has been manufactured and packaged. Data is written into the cells of EEPROM 8 by entering the test mode and entering the correct key (in response to data, including key bits, determined by the input signal), then writing the appropriate bit sequence into the cells of EEPROM 8, and then sending a high voltage (e.g. 15 volt) pulse (of the input signal) through HV switch 5 to the "vppi" input of each cell of EEPROM 8 (e.g., cell 80 of FIG. 13) to store the bits in the cells.

As noted, HV switch 5 is a safety switch that functions to ensure that EEPROM 8 is not accidentally programmed. The input of switch 5 is coupled to receive the Input signal asserted to pad 12 by test device 13. Switch 5 is controlled to pass through the Input signal at the appropriate time (when the Input signal has a sufficiently high level, e.g., 15 volts, to serve as a programming voltage for storing data in EEPROM 8). Test device 13 is preferably configured to assert the Input signal with a waveform of the type shown in FIG. 5, to implement a write to EEPROM 8. Test device 13 modulates the Input signal with a "Latch" pulse for at least half a clock period (from time T0 to time T1, in FIG. 5) to cause logic 3 to extract the "Latch" pulse and assert the extracted "Latch" pulse to circuit 11, thereby causing circuit 11 to close switch 5. Then, a predetermined time (e.g., one clock period) after the leading edge of the "Latch pulse" (i.e., at time T2 in FIG. 5), test device 13 increases the voltage on the Input line (and thus on the VPPI line coupled to the output of the closed HV switch 5) to the necessary level (e.g., 15 volts) to program EEPROM 8. The signal is held for a predetermined time necessary to program the EEPROM, e.g., 10 ms or 50 ms, and then test device 13 reduces the voltage on the Input line back down to within the normal logic operating levels (e.g., to a level midway between the high and low data thresholds, at time T3 in FIG. 5). After the leading edge of the "Latch" pulse, test device 13 does not allow the level of the Input signal to drop below the latch threshold until EEPROM 8 has been programmed. The reason for this latter requirement is that, if the Input signal dropped below the latch threshold after a "Latch" pulse (as does the dashed waveform between times T1 and T2 of FIG. 5) and a VPPI pulse (increasing up to and above the latch threshold to a level of 15 volts) then followed the Latch pulse, logic circuitry 3 could undesirably construe both the Latch and VPPI pulses as separate data pulses, thereby skewing the extraction of subsequent data bits from the Input signal.

Figure 5:
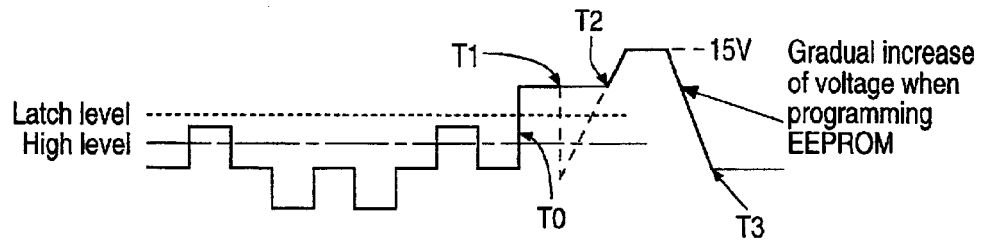
FIG. 5 is the waveform of a typical signal asserted from test circuit 13 to circuit 1 of FIG. 1.
Figure 6:
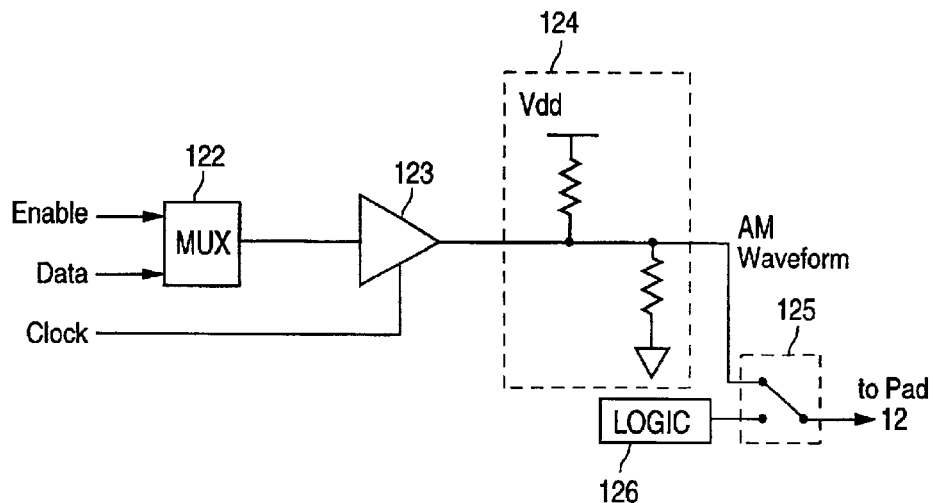
FIG. 6 is a simplified schematic diagram of elements of an embodiment of test circuit 13 of FIG. 1.

Preferably, The amplitude of the VPPI pulse gradually increases (as shown in FIG. 5) from the level at time T2 up to the 15 volt maximum level in order to protect EEPROM 8 from being damaged by a sudden 15 volt pulse. Since the VPPI pulse typically remains at its high "programming" level for many clock cycles, the clock timeout circuitry (i.e., circuitry 31) is configured to prevent termination of a test mode while VPPI remains high during programming of EEPROM 8. Specifically, the "TMOVride" signal is asserted with a high level to circuitry 31 while EEPROM 8 is programmed, thus providing a path for discharging the capacitor within circuitry 31, and forcing the level of Clk-Good (at the output of circuitry 31) to remain high during the programming.

As shown in FIG. 13, the bit (labeled "EEMaster" in FIG. 13) stored in each cell is available at one input of multiplexer and flip-flop 81 and at one input of multiplexer 82. In response to bit TMX<1> from decoder 9, circuit 81 outputs (as the "srbit" output) either the bit "EEMaster" (e.g., when TMX<1> is high), or the "Datain" bit at the cell's input (e.g., when TMX<1> is low), during each cycle of the Clock signal. In response to bit "eefromsr" from register 7, multiplexer 82 passes either the output of flip-flop 81 (which is typically the "Datain" bit when multiplexer 82 passes the output of flip-flop 81) or the "EEMaster" bit stored in cell 80.

Depending on the level of bit TMX<2> from decoder 9, cell 80 is either in a state in which it can store the bit at its input (when a high voltage pulse is asserted at the cell's "vppi" input) or a state in which it is disabled from storing such bit.

The output of the last cell 80 of EEPROM 8 (labeled "EEmaster" in FIGS. 1 and 13) is coupled to circuit 11 (for the purpose to be described below) and to a probe pad (e.g., pad 8A of FIG. 1). Since a high value of "EEmaster" disables EEPROM 8 from being written to, it is important to ensure that chip 1 is initially manufactured with a low value of "EEmaster." Thus, an external device can determine the state of the "EEmaster" bit by accessing pad 8A, and this bit can be cleared (e.g., at the factory) before chip 1 is used. In each cell of EEPROM 8 other than the last cell, the "EEmaster" output is omitted.

With reference to FIG. 13, the output of multiplexer 82 in the "n"th cell of EEPROM 8 is the bit identified as "eebit<n>" in FIG. 13. The "eebit<n>" bits from all the cells (identified collectively as "eebit<23:0>" in FIG. 1) are output from EEPROM 8 for use by circuitry (e.g., operational circuitry 2) of chip 1, e.g., for configuring or reconfiguring such circuitry.

The "srbit" output from flip-flop 81 of the last cell of EEPROM 8 is the "Data Out" signal shown in FIG. 1, and is asserted to output buffer circuitry 10 of chip 1, for assertion via pad 12 to tester circuitry 13. The "Data Out" signal can be indicative of existing data stored in EEPROM 8, new data that has just been programmed into the cells of EEPROM 8, or data that tester 13 has just asserted to pad 12. In a preferred implementation, the "srbit" output from flip-flop 81 of EEPROM 8's last cell is asserted to a flip-flop that is configured to suppress each bit resulting from a "Latch" pulse (so that such bit is not asserted in the "Data Out" stream) and to assert all other bits of the "srbit" stream to output buffer 10, thereby determining the "Data Out" stream. Such a flip-flop would be cleared by the inverse of the "TME" signal (from state machine 4) asserted to EEPROM 8 as shown in FIG. 1.

The "data Out" signal output from EEPROM 8 is asserted to the input of amplifier 10A of output buffer circuitry 10. As noted, in order to assert the Input signal, circuit 13 tri-states pad 12 to an intermediate potential (typically equal to half the supply potential for chip 1), and drives pad 12 above and below this intermediate potential. Similarly, amplifier 10A (when it is enabled by bit TMX<0> from decoder 9) tri-states pad 12 to an intermediate potential, and then drives pad 12 above and below the intermediate potential in response to the "Data Out" signal. Logic circuitry 126 (shown in FIG. 6) within test circuit 13 extracts the data from the output of output buffer circuitry 10. Output buffer circuitry 10 includes resistor Ro shaving resistance equal to 5000 ohms in a preferred implementation) coupled between pad 12 and the output of amplifier 10A, to allow tester 13 to overdrive the circuitry being tested (during the test mode) when required. The resistance of resistor Ro should be chosen to avoid undesirably delay in the reading of data from pad 12 by tester 13.

Although chip 1 can be configured to assert digital or analog test data (indicative of the state of one or more devices, nodes, or circuits of chip 1) to tester 13 during a test mode, via either pad 12 or another pad (at another one of chip 1's external nodes), the only circuitry of this type that is shown in the Figures is output buffer 10 (of FIG. 1) for asserting digital data ("Data Out" from EEPROM 8) to pad 12. Typically, when tester 13 reads analog data from circuitry of chip 1, the signal of interest on chip 1 is protected by a buffer stage. This assures that internal nodes of chip 1 cannot be corrupted as a result of test mode operation.

For example, to allow testing of analog circuitry of chip 1, the chip can be implemented to include a first multiplexer having inputs coupled to nodes of the analog circuitry, and having an output coupled to a first input of a second multiplexer. A second input of the second multiplexer is coupled to the output of buffer 10. When a particular analog test mode has been selected by the four bits (Tmbit0–Tmbit3) output from register 7, one (or a subset) of the bits TMX<15:0> output from decoder 9 causes the first multiplexer to select the analog circuitry node that tester 13 wishes to probe. A control bit output from register 7 (e.g., Tmbit3) causes the second multiplexer to selectively couple to Node A either its first input (to cause chip 1 to assert an analog voltage indicative of the voltage at the selected analog circuitry node to Node A) or its second input (to cause chip to assert the buffered Digital Output from EEPROM 8 to Node A). Preferably, the first multiplexer includes a buffer stage (e.g., a voltage follower) which asserts to the first multiplexer's output an analog voltage indicative of the voltage at the selected input of the first multiplexer (i.e., the voltage at the selected analog circuitry node). Typically, such an implementation of chip 1 would include logic circuitry configured to allow tester 13 to terminate (at any desired time) a test mode in which chip 1 asserts an analog voltage to an external node (e.g., Node A). Also, when chip 1 asserts a measured analog voltage to an external node during a test mode, a longer settling time is typically needed to accurately measure and read the analog voltage than would be required to generate and read digital bits indicative of the analog voltage. Thus in preferred embodiments, during a test mode in which chip 1 asserts an analog voltage to an external node (e.g., Node A), at least one of the bits (Tmbit0–Tmbit3) asserted by register 7 is asserted with a level that prevents the "CLKGood" signal from terminating the test mode (or the "CLKGood" signal is otherwise prevented from terminating the test mode), and chip 1 is configured to terminate the test mode in some other way (e.g., in response to assertion of a "Latch" signal by tester 13, or a "low" level at pad 12, i.e., a level below the "Low" threshold which is typically about 250 mV, for at least a minimum time interval).

With reference again to FIG. 1, in circuit 11, the "Latch" signal from comparator 23 is inverted and the inverted Latch signal is asserted to an input of AND gate 11A. The other input of AND gate 11A is coupled to receive a signal (identified as "EEmaster" in FIG. 1) from EEPROM 8. By asserting the "EEmaster" signal to be indicative of a logical zero, EEPROM 8 indicates that it is ready to be written to. The output of AND gate 11A (identified as "ProgSD" in FIG. 1) is coupled to one input of a NOR gate within HV switch 5. The bit by "TMX<2>" from decoder 9 is asserted to the other input of this NOR gate, and the output of the NOR gate places HV switch 5 in a closed state (in which it passes the Input signal to EEPROM 8) or an open state (in which it decouples the Input signal from EEPROM 8). When switch 5 is closed, and the Input signal has a sufficiently high voltage level (e.g., 15 volts above ground), EEPROM 8 stores data (already present therein) in its nonvolatile cells.

NOR gate 29 (shown in FIG. 7) of logic circuitry 3 outputs the "Clock" signal (whose waveform is shown in FIG. 2), in response to the High and Low signals (output from comparators 21 and 22) at its inputs.

AND gate 32 (of FIG. 7) is coupled to receive an inverted version of the signal "Enabler" (asserted by LockRST circuit 30), and the signal "LockClose" (asserted by state machine 4, and to be described below). The output of AND gate 32 is asserted to one input of NOR gate 33.

Because the Input signal is going low or high while tester 13 is sending data to chip 1, the test mode circuitry of chip 1 must distinguish between the case that the Input signal is indicative of data (e.g., test data for use in a test mode) and the case that the Input signal is indicative of an enable signal (for use by operational circuitry 2 in a normal operating mode of chip 1). Logic circuitry 3 does this by using LockRST circuit 30 to generate the signal "SDanalog." Circuit 30 causes "SDanalog" to go high when the Input signal is low for longer than a predetermined minimum time interval (e.g., 100 microseconds), and "SDanalog" then to undergo a high-to-low transition when the Input signal again goes high. The signal "SDanalog" is asserted to circuits 21, 22, 23, and 31 and to the second input of NOR gate 33 (of logic 3). In response to a high level of "SDanalog" (i.e., when external circuitry 13 has not asserted data to chip 1 for the minimum time), circuits 21, 22, 23, and 31 are shut down to save power, and circuits 21, 22, 23, and 31 remain shut down until the Input signal triggers a test mode of chip 1. In response to a low level of "SDanalog" (i.e., in a test or configuration mode of chip 1), circuits 21, 22, 23, and 31 operate to extract data from the Input signal and to indicate whether data are being asserted to the external node with at least a minimum frequency.

The signal "EnableIC" is asserted to operational circuitry 2 (of FIG. 1). Operational circuitry 2 of FIG. 1 is enabled when "EnableIC" has a high level. In response to a low level of "EnableIC," operational circuitry 2 is disabled. Because the signal "SDanalog" is asserted to the second input of above-mentioned NOR gate 33, NOR gate 33 asserts a low level of "EnableIC" in response to a high level of "SDanalog." In a test mode of chip 1, the level of "EnableIC" depends on the state of each of "SDanalog," "LockClose," and the inverse of "EnableI." In the normal operating mode of chip 1, state machine 4 asserts the "LockClose" signal with a low level to AND gate 32 of logic circuitry 3, the signal "SDanalog" is low (to disable extraction of data from the Input signal), and the "EnableIC" signal has the same logical state as the Input signal.

Figure 8B:
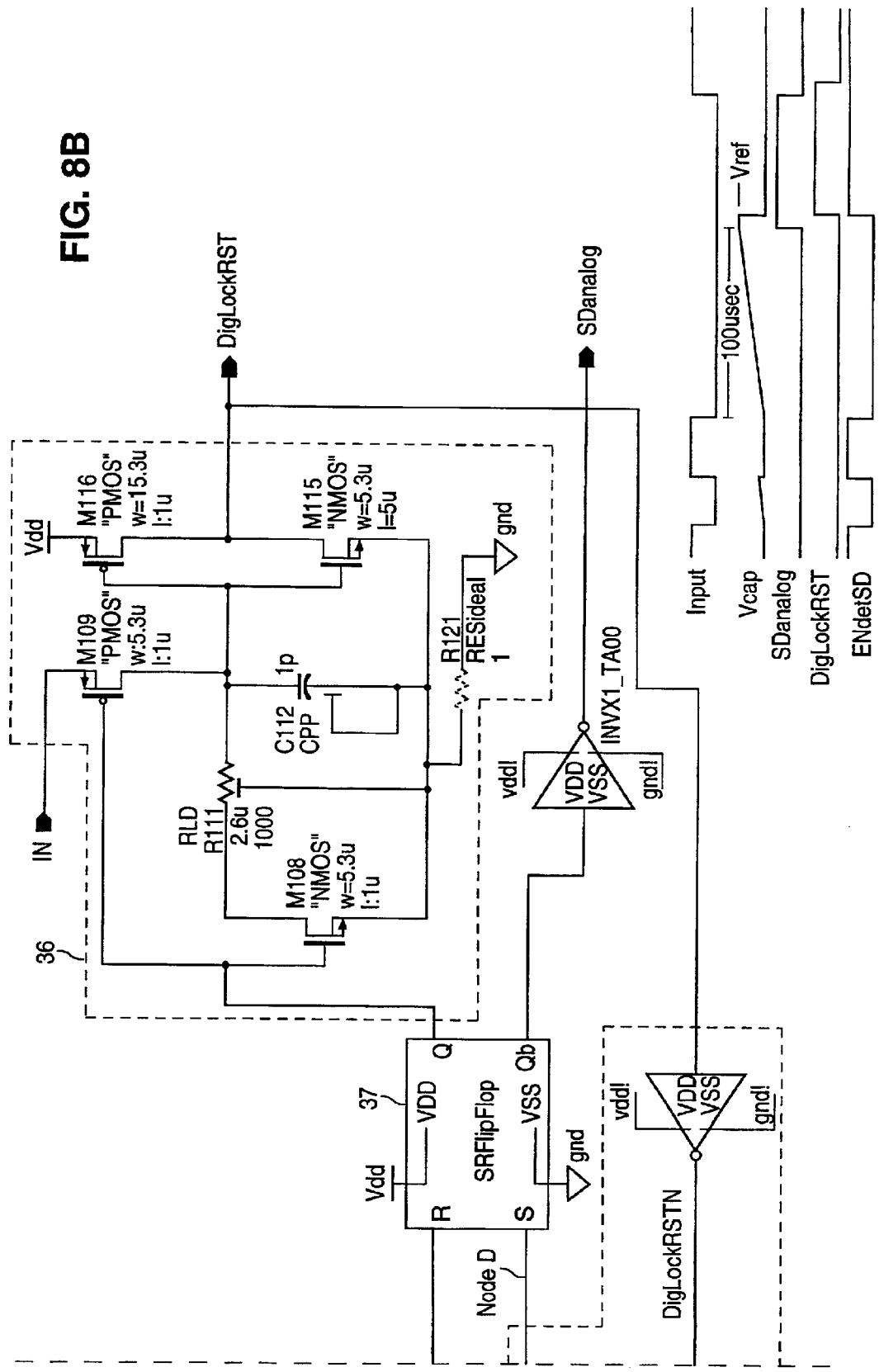
FIG. 8 (comprising FIGS. 8A and 8B) is a schematic diagram of an embodiment of circuit 30 of FIG. 7.

FIG. 8 is a diagram of a preferred embodiment of circuit 30 of FIG. 7. With reference to FIG. 8, we next describe various operations of circuit 30. Circuit 30 includes causes "SDanalog" to go high when the Input signal is low for longer than a threshold time interval (e.g., 100 microseconds). In FIG. 8, the inverse of the "Qb" output of SR flip-flop 37 ("set-reset" flip-flop 37) is the signal SDAnalog. Thus, SDanalog goes high when flip-flop 37 is set (when Node D, at the output of circuitry 34 goes high), and SDanalog goes low when the above-mentioned "Enabler" signal goes high (to reset flip-flop 37) after flip-flop 37 has been set.

Translation circuit 35 generates the "Enabler" signal, and its inverse (identified as "KeepLock" in FIG. 8), in response to the Input signal. The EnableI signal is a CMOS level representation of the Input signal (EnableI is high when Input is high and low when Input is low). The EnableI signal is asserted to the "reset" input of flip-flop 37. When the level of the Input signal changes rapidly (as is typical during test mode operation of chip 1), the CMOS inverter (comprising PMOS transistor M102 and NMOS transistor M70) of circuit 35 will sometimes be in an unknown state. For this reason, resistor R39 is connected between transistor M102's source and the top rail.

Circuitry 34 includes NMOS transistor N1 connected in parallel with capacitor C1 (having 14 picoFarad capacitance in a preferred implementation), and comparator circuitry coupled and configured to compare the potential at the top plate of capacitor C1 (Node B of FIG. 8) with reference potential Comp_hi (at node C of FIG. 8). The gate of transistor N1 is coupled to receive the ENdetSD signal, and a charging current ("Icharge," equal to 200 nA in a preferred implementation) is asserted to Node B (to the drain of N1 and the top plate of capacitor C1 connected thereto). The potential at Node B is compared to reference potential Comp_hi (asserted to Node C of circuitry 34 from Node E of FIG. 7). Reference potential Comp_hi is the "high" threshold potential employed by comparator 21 of FIG. 7, and is equal to (¾)Vdd in a preferred implementation of FIG. 7. If ENdetSD remains low for at least 100 microseconds (e.g., when the Input signal remains low for at least 100 microseconds when DigLockRST is low), then current Icharge causes the potential at Node B of FIG. 8 to rise above Comp_hi, thus causing Node D of FIG. 8 (at the output of the comparator circuit of circuitry 34) to go high, in turn "setting" the flip-flop 37 (to cause SDAnalog to go high, and DigLockRST to go high a short time after SDAnalog goes high).

Circuitry 34 also includes NMOS transistors N2 and N3 connected in parallel with transistor N1 between Node B and ground, with the gate of N2 coupled to receive the Input signal and the gate of N3 coupled to receive the TMOVride signal (which is the bit "Tmbit3" asserted by register 7 of FIG. 1). One or both of transistors N1 and N2 provides a path for discharging capacitor C1 whenever the Input signal is high. The TMOVride signal is asserted at one of the outputs of register 7 (i.e., the "Tmbit3" output), and its level is determined by the data extracted from the Input signal. In response to a high level of the TMOVride signal, transistor N1 turns on to provide a path for discharging capacitor C1, thus preventing circuitry 34 from setting flip-flop 37.

NMOS transistor M15 and PMOS transistors M34 and M46 function to disable the other transistors of the comparator circuitry (of circuitry 34) when ENdetSD goes high (ENdetSD is asserted to the gate of M15, and its inverse, ENdetSDN, is asserted to the common gates of M34 and M46). The current "IN" provided to the drain of M173 ("IN" is equal to 2 microAmps in a preferred implementation), and the charging current "Icharge" provided to Node B, are provided by a current source (not shown). Preferably, the current source is enabled by a low level of the SDanalog signal, and shuts down (to conserve power) in response to a high level of the SDanalog signal.

The signal "LatchBar" asserted to the gate of NMOS transistor M125 is an inverted version of the "Latch" signal asserted at the output of circuit 23 of FIG. 7. When "LatchBar" goes low (which occurs when the Input signal has a sufficiently high level to trigger a high level of the "Latch" signal), the comparator circuit of circuitry 34 is disabled.

Circuitry 34 also generates the ENdetSD signal (and its inverse) in response to the DigLockRST and Input signals. As shown in FIG. 8, ENdetSD is the output of a NAND gate whose inputs are the KeepLock signal (from circuitry 35) and DigLockRST signal (from circuitry 36). The ENdetSD signal is high (preventing flip-flop 37 from being "set" to cause a low-to-high transition of DigLockRST) when DigLockRST is high (regardless of the state of the Input signal) and when the Input signal is high, and the ENdetSD signal is low (allowing flip-flop 37 to be "set" when the Input signal remains low for sufficiently long) if the Input signal and DigLockRST are low. As noted, a high level of ENdetSD turns off the comparator circuitry of circuitry 34 of FIG. 8 to conserve power.

Circuitry 36 of FIG. 8 generates the "DigLockRSr" signal in response to output of flip-flop 37. The "DigLockRST" signal is a delayed version of the SDanalog signal, which is provided to key state machine 4 (to disable circuitry within state machine 4 thus placing the state machine in the below-mentioned "error state" when DigLockRST is high, or to enable circuitry within state machine 4 when DigLockRST is low) and to the above-described circuitry (within circuit 30) for generating the ENdetSD signal. Circuitry 36 includes capacitor C112 (having capacitance 1 picofarad in a preferred implementation), which is charged by the charging current "IN" supplied from a current source (not shown), when SDanalog is high. When SDanalog is low, capacitor C112 discharges (through resistor R111 and NMOS transistor M108). Thus, in response to a low-to-high transition of SDanalog, PMOS transistor M116 turns on and NMOS transistor M115 turns off after a delay determined by the rate at which capacitor C112 discharges. In response to a high-to-low transition of SDanalog, PMOS transistor M116 turns off and NMOS transistor M115 turns on after a delay determined by the rate at which capacitor C112 charges. The delay (between each transition of the SDanalog signal and the corresponding transition of DigLockRST) is implemented to avoid oscillatory states from flip-flop 37, since the DigLockRST signal is used (as described above) to generate the ENdetSD signal that is in turn used to enable and disable the circuitry (within circuit 30) for generating the SDanalog signal.

The Clock signal asserted by NOR gate 29 of FIG. 7 is provided to state machine 4 and shift register circuitry 6, and to logic 28 within logic circuitry 3.

Figure 4:
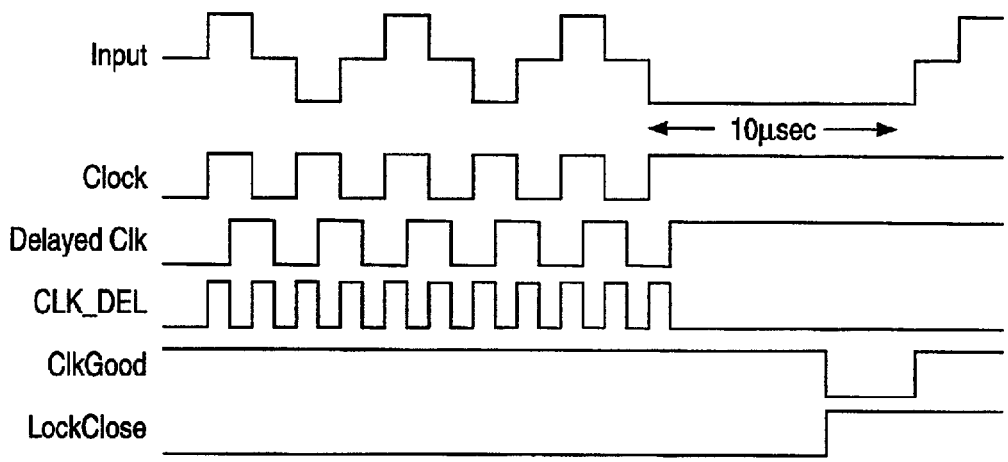
FIG. 4 is a timing diagram showing waveforms of some of the signals asserted to and generated by the test circuitry of FIG. 1.
Figure 9:
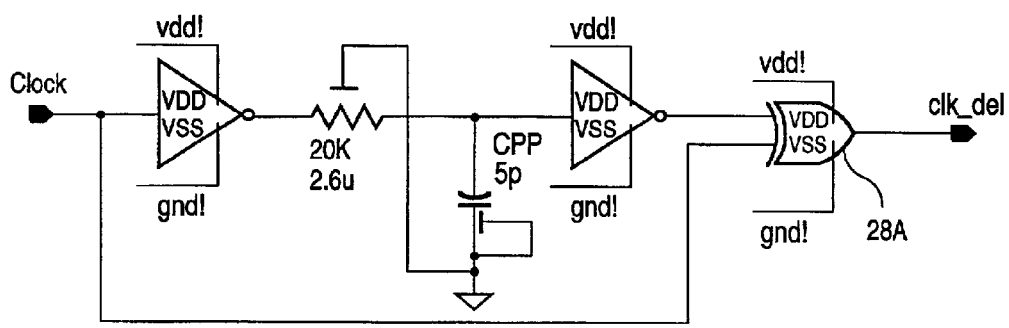
FIG. 9 is a schematic diagram of an embodiment of logic circuitry 28 of circuit 30 of FIG. 7.

Logic circuitry 28 asserts a signal "Clk_Del" having waveform shown in FIG. 4) in response to the Clock signal, and asserts the Clk_Del signal to logic circuitry 31. FIG. 9 is a preferred implementation of logic circuitry 28 which senses whether there is an edge on (a transition of) the Clock signal. One input of Exclusive OR gate 28A of FIG. 9 receives the Clock signal. The other input of Exclusive OR gate 28A receives a delayed version (delayed by 1 microsecond in the implementation shown) of the Clock signal (identified as "Delayed Clk" in FIG. 4). The output of gate 28A is high when the Clock signal is different from the Delayed Clk signal.

In response to the "Clk_Del" signal, logic circuitry 31 (shown in FIG. 7) generates a "ClkGood" signal which is indicative of a logical zero when the Input signal is low for at least 10 microseconds (or another minimum time interval shorter than the minimum time interval for which the Input signal must be held low to cause "SDanalog" to be indicative of a logical one) and is otherwise indicative of a logical one. Logic circuitry 31 has the same structure as does the circuitry shown in FIG. 8 (within circuit 30) for generating "SDanalog," except as follows: the capacitor (that corresponds to capacitor C1 of FIG. 8) has a lower capacitance (e.g., 1.6 pF, where C1 has capacitance 14 pF) and is charged and discharged in response to the Clk_Del signal generated by circuit 28 of FIG. 7 (rather than by the Input signal itself), the SDanalog signal (rather than the ENdetSD signal) is asserted to the gate of the transistor that corresponds to transistor N1 of FIG. 8), transistors M125 and M41 (of the FIG. 8 circuit) are replaced by short circuits, and the ClkGood signal is the voltage at the node of circuit 31 that corresponds to Node D of the FIG. 8 circuit (circuit 31 does not include an SR flip-flop corresponding to flip-flop 37 of FIG. 8). Assertion of the "TMOVride" signal with a high level to circuitry 31 provides a path for discharging the capacitor within circuitry 31, thus forcing the level of CLkGood to remain high.

Figure 10:
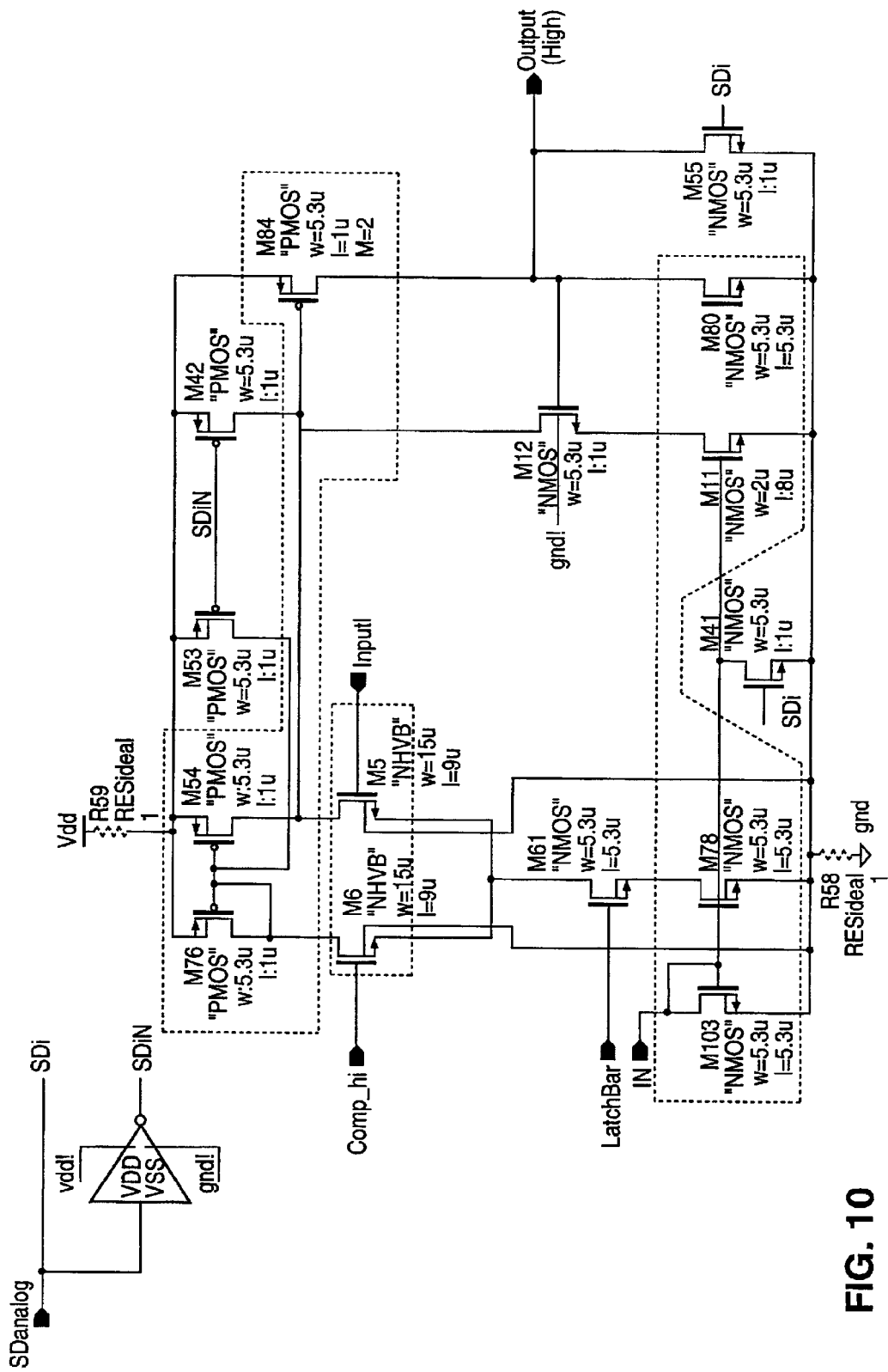
FIG. 10 is a schematic diagram of an embodiment of comparator 21 of FIG. 7.

FIG. 10 is a schematic diagram of an embodiment of comparator 21 of FIG. 7. As shown in FIG. 10, the Input signal is asserted to the gate of high voltage NMOS transistor M5 and the Comp_hi threshold potential is asserted to the gate of high voltage NMOS transistor M6. The "LatchBar" signal asserted to the gate of NMOS transistor M61 is an inverted version of the "Latch" signal asserted at the output of circuit 23 of FIG. 7. When "LatchBar" goes low (which occurs when the Input signal has a sufficiently high level to trigger a high level of the "Latch" signal), the comparator circuit of FIG. 10 is disabled. In response to a high level of the signal SDanalog, transistors M11, M54, M76, M78, M80, M84, M90, and M103 of the FIG. 10 circuit are switched off to reduce power consumption, and the "High" signal asserted at the output is forced low.

Figure 11:
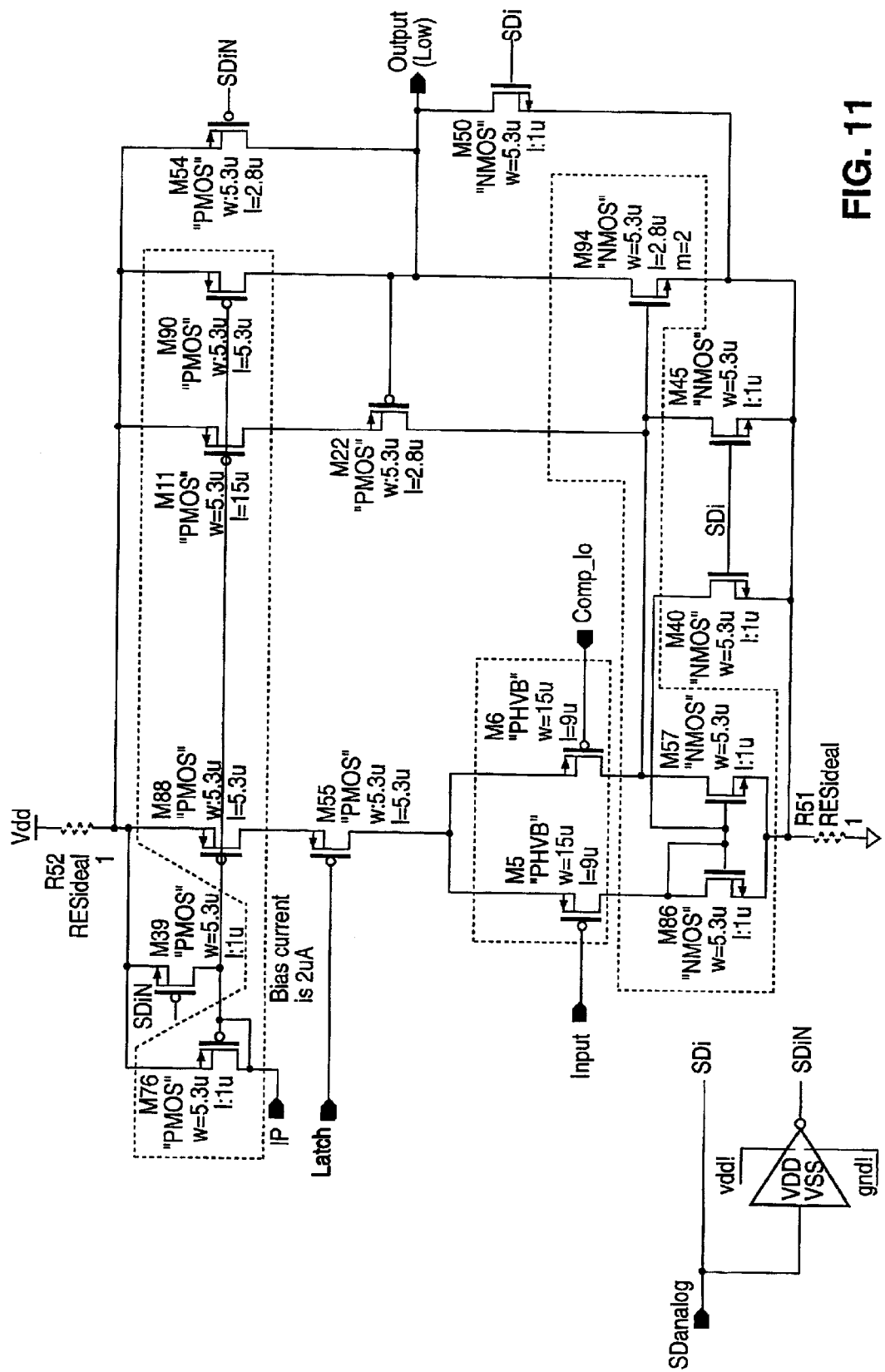
FIG. 11 is a schematic diagram of an embodiment of comparator 22 of FIG. 7.

FIG. 11 is a schematic diagram of an embodiment of comparator 22 of FIG. 7. As shown in FIG. 11, the Input signal is asserted to the gate of high voltage PMOS transistor M5 and the Comp_lo threshold potential is asserted to the gate of high voltage PMOS transistor M6. When "Latch" goes high (which occurs when the Input signal has a sufficiently high level to trigger a high level of the "Latch" signal), the comparator circuit of FIG. 11 is disabled. In response to a high level of the signal SDanalog, transistors M86, M57, M89, M88, M11, M90, and M94 of the FIG. 11 circuit are switched off to reduce power consumption. The bias current IP drawn from the drain of PMOS transistor M89 is 2 microAmps in a preferred implementation.

State machine 4 (sometimes referred to as a "digital lock") of the test circuitry of FIG. 1 functions to initiate test mode operation of chip 1 by comparing data extracted (by logic 3) from the Input signal (asserted by external tester 13 to pad 12) with a predetermined key. The key is a predetermined bit sequence. Preferably, the key is a pseudorandom sequence (e.g., 10010110011101 in a preferred implementation) selected to minimize the chance that the inventive circuitry will accidentally trigger test mode operation of chip 1.

In response to an Input signal that is indicative of the key, state machine asserts an enable signal (labeled "TME" in FIG. 1) to register circuitry 6 and 7 and decoder 9 to trigger test mode operation of chip 1, and the inverse of the "TME" signal is asserted to EEPROM 8. In the test mode, tester 13 can test, configure, or fine-tune circuitry of chip 1. If an incorrect key is asserted by tester 13, or if tester 13 asserts data with frequency below the minimum frequency, state machine 4 enters an error state (sometimes referred to as an "error mode" of operation) that disables chip 1's test mode circuitry. To exit the error state, the Input signal is held low for longer than a threshold time (e.g., 100 microseconds) before another attempt is made to initiate test mode operation. 4: State machine 4 operates in response to the ClkGood signal (from logic circuitry 3, and more specifically from circuit 31 of FIG. 7) by entering the error state when ClkGood is low. In the error state, state machine 4 asserts the "LockClose" signal with a high level to AND gate 32 of logic circuitry 3 (to cause the Enable IC signal to have the same logical state as the Input signal, provided that SDanalog is low).

State machine 4 preferably operates in one of four states: the above-mentioned error state (in which logic 3 is disabled from extracting data from the incoming Input signal); a "begin" state (in which state machine 4 awaits the first bit of data of a possible key); a "decision" state that accepts the next bit of incoming data where each previously received bit of the data is potentially a portion of a valid key (to determine whether the incoming data is indicative of a valid key); and a test-mode enable state (in which state machine 4 has identified a key and asserts the signal "TME" with a level that enable test or configuration mode operation of chip 1).

State machine 4 enters the "begin" state in response to a high-to-low transition of the DigLockRST signal from logic circuitry 3. State machine 4 enters the "error" state (from the "begin" or "decision" state) in response to the earliest of the following events: state machine 4 determines that an incoming data bit or sequence of incoming data bits does not match a bit or sequence of bits of a valid key, and a time window (e.g., 100 microseconds in a preferred implementation) elapses without state machine having identified a valid key. In a preferred implementation, state machine 4 asserts the "LockClose" signal with a high level (and "SE" with a low level) upon entering the error state, and asserts the "LockClose" signal with a low level (and "TME" with a high level) upon entering the test-mode enable state. State machine 4 enters the "error" state (from the test-mode enable state) in response to a high-to-low transition of the ClkGood signal.

Thus, in a preferred implementation of chip 1, the safety features for preventing accidental entry into test mode operation include the following: data must be asserted with at least a minimum frequency (the test circuitry includes a timeout circuit that disables test mode operation if the frequency of the clock extracted from the incoming data is too low); a digital key must be asserted (the key must be asserted with no errors, and must be recognized by the state machine, to enable test mode operation); there is a limited "lock open" time window (there is a limited window of opportunity in which to enter the test mode by asserting a valid key, commencing when the state machine is placed in its "begin" state); only one key assertion attempt is allowed (if an incorrect key bit is entered, the "lock open" time window closes); a minimum rest time is required before the state machine can be placed in its "begin" state (the Input signal must be held low for a minimum time, e.g., 100 microseconds, before a transition of the Input signal can place the state machine in its "begin" state).

Even if test mode operation is accidentally initiated (despite the typically very low probability that this could occur), the inventive test mode circuitry is preferably implemented to terminate such test mode operation (e.g., in response to a transition of a ClkGood signal) in the event that the Input signal remains low for at least a minimum time (e.g., 10 microseconds), and the operational circuitry of chip 1 preferably functions (in an accidentally triggered test mode) as it would during a normal operating mode of chip 1.

The data received on the Input line can include control and configuration information to be stored in EEPROM 8 (or in other nonvolatile memory or volatile memory within chip 1). The control and configuration information can be used to adjust the electrical characteristics of analog circuitry within chip 1 and to change the configuration of analog and/or digital circuitry within chip 1. Additionally, the control and configuration information can put chip into one of various test modes. In some of the test modes, an internal node of chip 1 (e.g., a node within operational circuitry 2) is connected to Node A (pad 12) or another external node of chip 1. In other ones of the test modes, chip 1 is reconfigured from one configuration to another (e.g., from a normal configuration into modified configuration). For example, internal analog amplifiers can be switched in or out of a signal path, voltage measurement circuits can be connected or disconnected from an external node, and internal offset or gain values can be adjusted, all of which will change the operational characteristics of chip 1. The bits TMX<15:0> asserted at the output of decoder 9 determine the test or configuration mode (or normal operating mode) in which chip 1 operates, and at least some of the operations performed by chip 1 in such mode.

Although the FIG. 1 embodiment includes an EEPROM (EEPROM 8), other embodiments of the invention include other types of nonvolatile memory (e.g., a nonvolatile memory including one-time programmable memory elements (such as an electrically programmable read only memory, or EPROM), or a set of fuses (such as polysilicon or metal fuses) that are selectively "blown" to produce an array of open circuit elements, or "antifuses" in which circuit components (such as zener diodes) are selectively "zapped" to produce an array of shorted circuit elements).

Figure 12A:
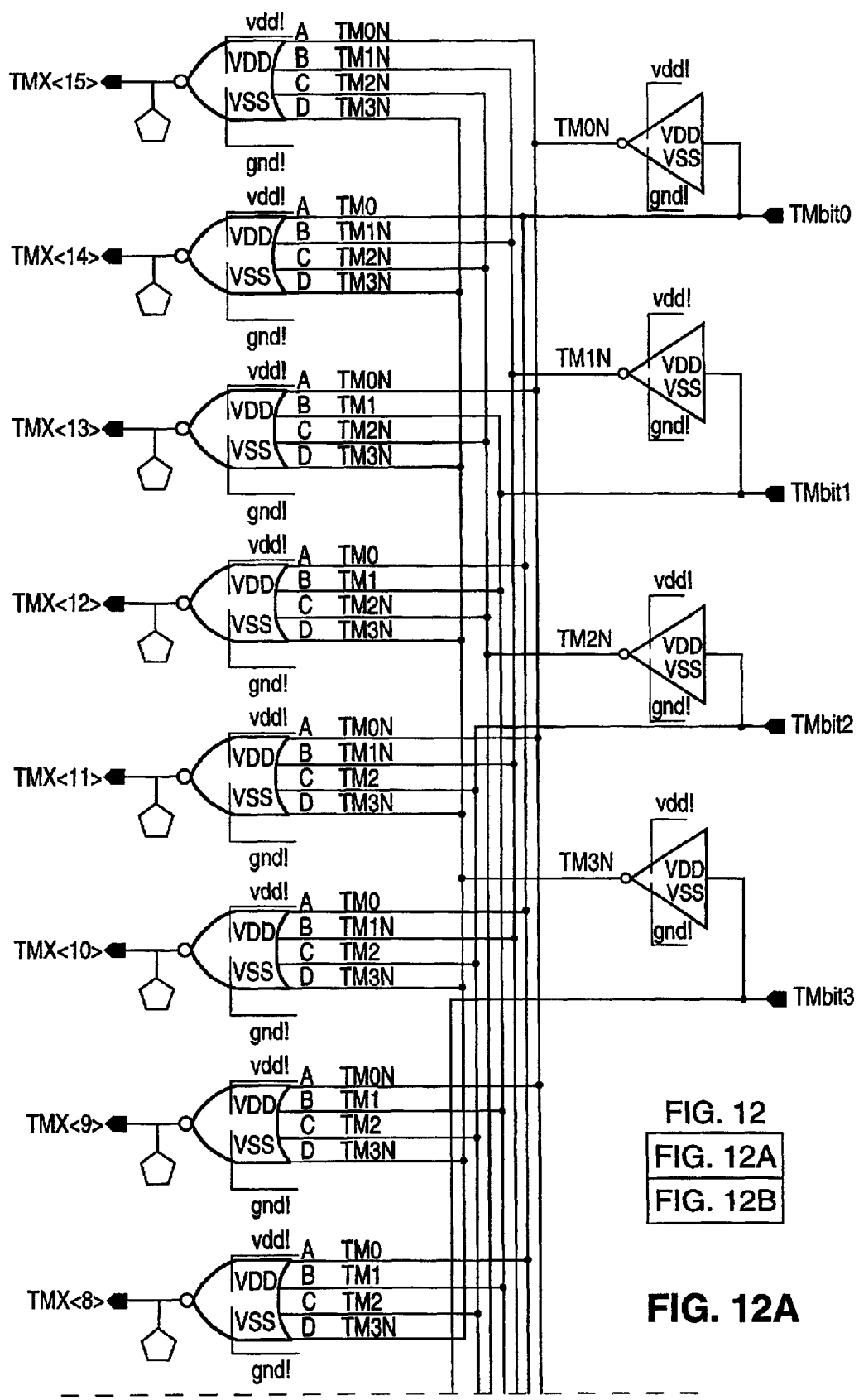
FIG. 12 (comprising FIGS. 12A and 12B) is a schematic diagram of an, embodiment of decoder 9 of FIG. 1.
Figure 12B:
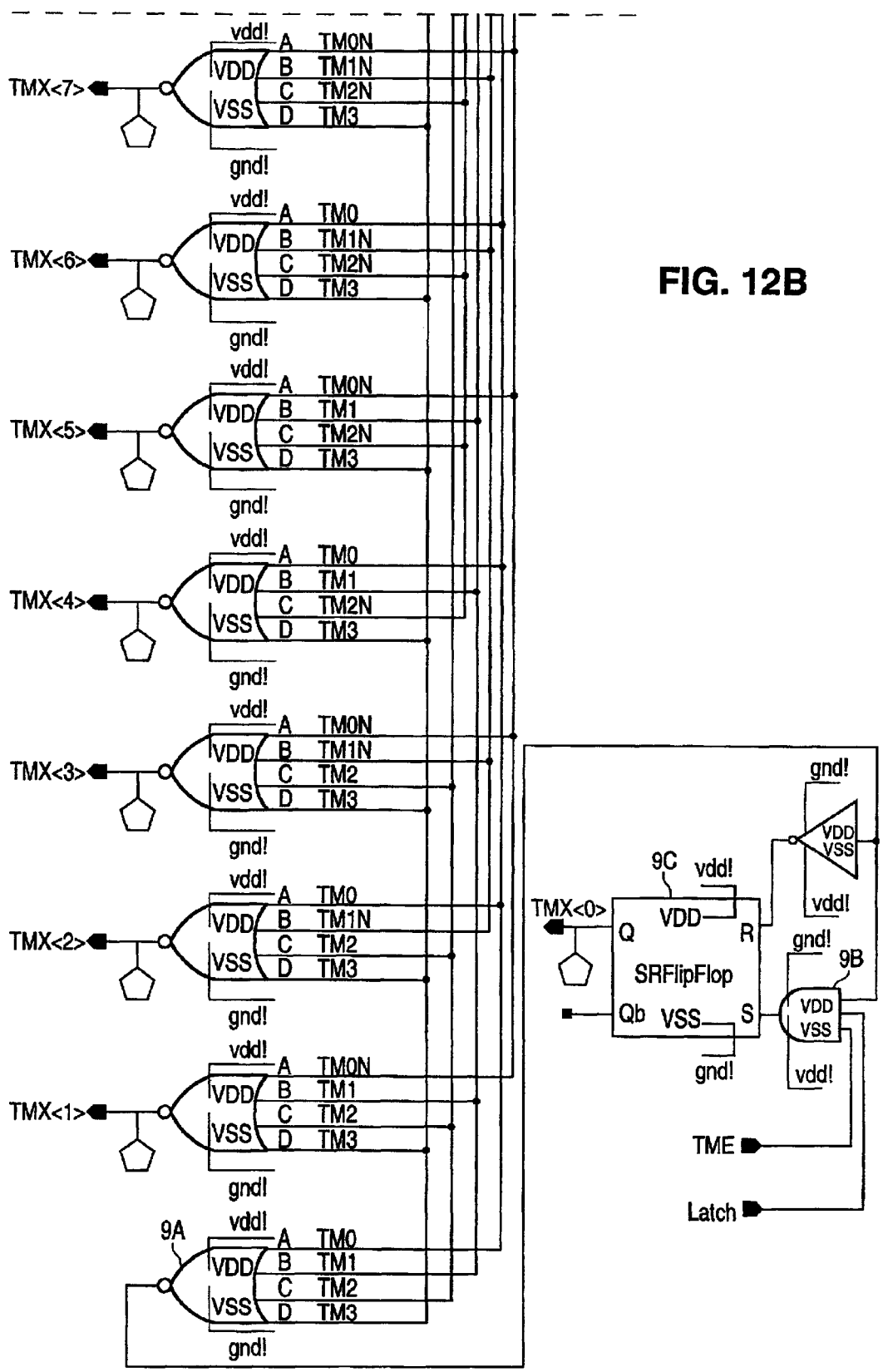

FIG. 12 is a schematic diagram of an embodiment of decoder circuit 9 of FIG. 1. The FIG. 12 decoder includes four inverters which receive the input bits Tmbit0–Tmbit3. In response, the inverters assert the bits TM0N (the inverse of Tmbit1), TM1N (the inverse of Tmbit0), TM2N (the inverse of Tmbit2), and TM3N (the inverse of Tmbit3). The FIG. 12 decoder also includes sixteen NOR gates, each of which is coupled to receive a different subset (shown in FIG. 12) of the bits Tmbit0–Tmbit 3 and TM0N–TM3N. Each of fifteen of the NOR gates asserts one of the bits TMX<1:15> at its output. The output of the tri remaining one of the NOR gates (NOR gate 9A) is coupled to one input of AND gate 9B, and to the reset input of SR flip-flop 9C. The output of AND gate 9B is asserted to the "set" input of SR flip-flop 9C. The bit TMX<0> is asserted at the output of flip-flop 9C. The other two inputs of AND gate 9B are coupled to receive the above-described "TME" signal (from state machine 4) and the above-described "Latch" signal (from logic circuitry 3).

Another aspect of the invention is test circuitry suitable for use in a circuit having an access node and operational circuitry configured to operate in response to at least one control signal (e.g., an enable signal) determined by a signal asserted to the access node. In use (with the circuit), the test circuitry is coupled to the access node and to the operational circuitry. Each embodiment of the test-circuitry is configured to perform the same functions performed by the test circuitry of one of the embodiments of the inventive integrated circuit (with the access node corresponding to the external node of each such embodiment of the inventive integrated circuit).

Although only one preferred embodiment has been described in detail (and alternative embodiments have also been described), those having ordinary skill in the art will appreciate that many modifications are possible without departing from the teachings set forth herein. All such modifications are intended to be encompassed within the following claims.

What is claimed is:

1. An integrated circuit, comprising:
   an external node;
   operational circuitry; and
   test circuitry coupled to the external node and the operational circuitry, wherein the test circuitry is configured to operate in at least one test mode in response to test data received at the external node from an external source, and the test circuitry is configured to assert to the operational circuitry a control signal in response to an external control signal received at the external node, wherein the control signal has a state determined by the external control signal but not by the test data.

2. The integrated circuit of claim 1, wherein the test circuitry is configured to extract the test data from an amplitude-modulated input signal asserted to the external node from the external source, and to generate the control signal in response to the input signal.

3. The integrated circuit of claim 2, wherein the external control signal is a binary signal determined by the input signal, and the test circuitry is operable in a mode in which the control signal is a binary signal whose state is determined by the state of the external control signal.

4. The integrated circuit of claim 2, wherein the test circuitry is configured to extract a clock signal from the input signal, and to operate in response to the clock signal during said at least one test mode.

5. The integrated circuit of claim 2, wherein the input signal has at least three levels, including a low level below a first threshold, a high level above a second threshold, and an intermediate level between the first threshold and the second threshold, and wherein the test circuitry includes:
   first comparator circuitry, coupled to receive the input signal and configured to operate in a first mode in which said first comparator circuitry generates a first signal indicative of whether the input signal has a level less than the first threshold; and
   second comparator circuitry, coupled to receive the input signal and configured to operate in a first mode in which said second comparator circuitry generates a second signal indicative of whether the input signal has a level greater than the second threshold.

6. The integrated circuit of claim 5, wherein the test circuitry also includes:
   a flip-flop having a set terminal, a reset terminal, and an output, wherein the set terminal is coupled to receive the second signal, the reset terminal is coupled to receive the first signal, the output asserts a data signal in response to the first signal and the second signal, and the data signal is indicative of the test data.

7. The integrated circuit of claim 2, wherein the test circuitry includes:
   comparator circuitry coupled and configured to receive the input signal, to extract the test data from the input signal, and to extract a latch signal from the input signal, where the latch signal is indicative of whether the input signal has a level exceeding a latch threshold; and
   at least one register coupled to the comparator circuitry for receiving the latch signal and at least some of the test data.

8. The integrated circuit of claim 1, wherein the at least one test mode includes a first test mode, and the test circuitry is configured to assert data to the external node, for transmission to external circuitry, during the first test mode.

9. The integrated circuit of claim 8, wherein the first test mode is a measurement mode, and the test circuitry is configured to assert measurement data to the external node during the measurement mode.

10. The integrated circuit of claim 1, wherein the operational circuitry is configured to operate in response to the control signal.

11. The integrated circuit of claim 10, said integrated circuit also including at least one additional external node.

12. The integrated circuit of claim 1, wherein the operational circuitry is configured to operate in response to the control signal and at least one additional control signal.

13. The integrated circuit of claim 12, said integrated circuit also including at least one additional external node.

14. An integrated circuit, comprising:
   an external node;
   operational circuitry; and
   test circuitry coupled to the external node and the operational circuitry, wherein the test circuitry is configured to operate in at least one test mode in response to test data received at the external node from an external source, and the test circuitry is configured to assert to the operational circuitry a control signal in response to an external control signal received at the external node, wherein the test circuitry is configured to extract the test data from an amplitude-modulated input signal asserted to the external node from the external source, and to generate the control signal in response to the input signal, wherein the input signal has at least three levels, including a low level below a first threshold, a high level above a second threshold, and an intermediate level between the first threshold and the second threshold, and wherein the test circuitry includes:
   first comparator circuitry, coupled to receive the input signal and configured to operate in a first mode in which said first comparator circuitry generates a first signal indicative of whether the input signal has a level less than the first threshold;
   second comparator circuitry, coupled to receive the input signal and configured to operate in a first mode in which said second comparator circuitry generates a second signal indicative of whether the input signal has a level greater than the second threshold; and
   logic circuitry coupled and configured to generate a second control signal in response to the input signal, and to assert the second control signal to the first comparator circuitry and the second comparator circuitry, wherein the second control signal is indicative of whether the input signal has a level that has remained below the first threshold for at least a predetermined minimum time, and wherein the second control signal disables each of the first comparator circuitry and the second comparator circuitry from operating in the first mode when the second control signal indicates that the level of input signal has remained below the first threshold for at least the predetermined minimum time.

15. An integrated circuit, comprising:
   an external node;
   operational circuitry; and
   test circuitry coupled to the external node and the operational circuitry, wherein the test circuitry is configured to operate in at least one test mode in response to test data received at the external node from an external source, and the test circuitry is configured to assert to the operational circuitry a control signal in response to an external control signal received at the external node, wherein the test circuitry is configured to extract the test data from an amplitude-modulated input signal asserted to the external node from the external source, and to generate the control signal in response to the input signal, wherein the input signal has at least four levels, including a low level below a first threshold, a high level above a second threshold, an intermediate level between the first threshold and the second threshold, and a latch level above a third threshold, where the third threshold is greater than the second threshold, and wherein the test circuitry includes:

first comparator circuitry, coupled to receive the input signal and configured to operate in a first mode in which said first comparator circuitry generates a first signal indicative of whether the input signal has a level less than the first threshold;

second comparator circuitry, coupled to receive the input signal and configured to operate in a first mode in which said second comparator circuitry generate a second signal indicative of whether the input signal has a level greater than the second threshold; and third comparator circuitry, coupled and configured to generate a latch signal indicative of whether the input signal has a level greater than the third threshold.

16. An integrated circuit, comprising:

an external node;

operational circuitry; and test circuitry coupled to the external node and the operational circuitry, wherein the test circuitry is configured to operate in at least one test mode in response to test data received at the external node from an external source, and the test circuitry is configured to assert to the operational circuitry a control signal in response to an external control signal received at the external node, wherein the test circuitry is configured to extract the test data from an amplitude-modulated input signal asserted to the external node from the external source, and to generate the control signal in response to the input signal, wherein the test circuitry includes:

comparator circuitry coupled and configured to receive the input signal, to extract the test data from the input signal, and to extract a latch signal from the input signal wherein the latch signal is indicative of whether the input signal has a level exceeding a latch threshold;

at least one register coupled to the comparator circuitry for receiving the latch signal and at least some of the test data; and a nonvolatile memory comprising at least one programmable cell having a first input coupled to receive a sequence of bits of the test data, and a second input coupled to receive a programming voltage, wherein the cell is operable in a mode in which the cell stores one of the bits of the test data being asserted at the first input while the programming voltage exceeds a programming level.

17. The integrated circuit of claim 16, also including:

a switch, coupled between the external node and the second input of the cell, wherein the switch has a closed state in which it passes the input signal to the second input of the cell, and wherein the input signal is said programming voltage.

18. The integrated circuit of claim 17, wherein the input signal includes a programming pulse having a leading edge, and a level that rises to at least the latch threshold at the leading edge, and then reaches the programming level without falling below the latch threshold, and then falls to below the latch threshold, whereby said one of the bits of the test data at the first input of the cell is stored in said cell in response to the programming pulse of the input signal.

19. An integrated circuit, comprising:

an external node;

operational circuitry; and test circuitry coupled to the external node and the operational circuitry, wherein the test circuitry is configured to operate in at least one test mode in response to test data received at the external node from an external source, and the test circuitry is configured to assert to the operational circuitry a control signal in response to an external control signal received at the external node, wherein the test circuitry is configured to extract the test data from an amplitude-modulated input signal asserted to the external node from the external source, and to generate the control signal in response to the input signal, and wherein the test circuitry includes:

a nonvolatile memory comprising at least one programmable cell having a first input coupled to receive a sequence of bits of the test data, and a second input coupled to receive a programming voltage, wherein the cell is operable in a mode in which the cell stores one of the bits of the test data being asserted at the first input while the programming voltage exceeds a programming level.

20. An integrated circuit, comprising:

an external node;

operational circuitry; and test circuitry coupled to the external node and the operational circuitry, wherein the test circuitry is configured to operate in at least one test mode in response to test data received at the external node from an external source, and the test circuitry is configured to assert to the operational circuitry a control signal in response to an external control signal received at the external node, wherein the test circuitry is configured to extract the test data from an input signal asserted to the external node from the external source, and wherein the test circuitry includes:

a timeout circuit coupled and configured to terminate operation of the test circuitry in each said test mode unless bits of the lest data occur at the external node with frequency not less than a predetermined minimum frequency.

21. An integrated circuit, comprising:

an external node;

operational circuitry; and test circuitry coupled to the external node and the operational circuitry, wherein the test circuitry is configured to operate in at least one test mode in response to test data received at the external node from an external source, and the test circuitry is configured to assert to the operational circuitry a control signal in response to an external control signal received at the external node, wherein the test circuitry includes:

logic circuitry coupled and configured to extract the test data from an input signal asserted to the external node from the external source;

lock circuitry coupled to receive the test data, and operable to analyze the test data to determine whether said test data is indicative of a digital key, and to generate a second control signal in response to determining that said test data is indicative of the digital key; and additional circuitry, coupled to the logic circuitry and configured to perform at least one test mode operation when the test circuitry is in each said test mode, wherein the lock circuitry asserts the second control signal to the additional circuitry to initiate each said test mode of the test circuitry.

22. The integrated circuit of claim 21, wherein the lock circuitry is a state machine operable in each of at least a begin state, a decision state, a test-mode enable state, and an error state, wherein the state machine in the begin state is ready to analyze a bit of the test data to determine whether said bit is an element of the digital key, the state machine in the decision state has received at least one bit of the test data but has not determined whether the test data is indicative of the digital key, the state machine in the test-mode enable state has received at least one bit or the test data and determined that the test data received thereby is indicative of the digital key, and the state machine in the error state has received at least one bit of the test data and determined that the test data received thereby is not indicative of the digital key.

23. The integrated circuit of claim 22, wherein the state machine is configured to remain in the decision state for no more than a predetermined interval of time commencing on entry into the decision state, and to undergo a transition from the decision state to the error state if said state machine has not undergone a transition from the decision state to one of the test-mode enable state and the error state during said predetermined interval of time commencing on entry into the decision state.

24. The integrated circuit of claim 22, wherein the state machine is configured to remain in the error state for at least a predetermined rest interval commencing on entry into said error state, and to undergo a transition from the error state to the begin state in response to first occurrence of a predetermined data structure of the input signal after said predetermined rest interval.

25. Test circuitry suitable for use in a circuit comprising an access node, and operational circuitry configured to operate in response to at least one control signal asserted to the access node, said test circuitry comprising:

logic circuitry configured to be coupled to the access node and to the operational circuitry; and additional circuitry coupled to the logic circuitry and configured to operate in at least one test mode in response to test data received at the access node, wherein the logic circuitry is configured to extract the test data from an amplitude-modulated input sigal asserted to the access node when the logic circuitry is coupled to the access node, and to generate the control signal in response to the input signal such that the control signal has a state determined by the input signal but not by the test data, and assert said control signal to the operational circuitry when the logic circuitry is coupled to the access node and to the operational circuitry.

26. The test circuitry of claim 25, wherein the logic circuitry is configured to extract a clock signal from the input signal, and to assert the clock signal to the additional circuitry, when the logic circuitry is coupled to the access node and to the operational circuit, and the additional circuitry is configured to operate in response to the clock signal during said at least one test mode.

27. The test circuitry of claim 25, wherein the input signal has at least three levels, including a low level below a first threshold, a high level above a second threshold, and an intermediate level between the first threshold and the second threshold, and wherein the logic circuitry includes:

first comparator circuitry, configured to be coupled to receive the input signal and to operate in a first mode in which said first comparator circuitry generates a first signal indicative of whether the input signal has a level less than the first threshold; and second comparator circuitry, configured to be coupled to receive the input signal and to operate in a first mode in which said second comparator circuitry generates a second signal indicative of whether the input signal has a level greater than the second threshold.

28. The test circuitry of claim 27, wherein the logic circuitry also includes:

a flip-flop having a set terminal, a reset terminal, and an output, wherein the reset terminal is coupled to receive the first signal, the set terminal is coupled to receive the second signal, the output asserts a data signal in response to the first signal and the second signal, and the data signal is indicative of the test data.

29. Test circuitry suitable for use in a circuit comprising an access node, and operational circuitry configured to operate in response to at least one control signal asserted to the access node, said test circuitry comprising:

logic circuitry configured to be coupled to the access node and to the operational circuitry; and additional circuitry coupled to the logic circuitry and configured to operate in at least one test mode in response to lost data received at the access node, wherein the logic circuitry is configured to extract the test data from an amplitude-modulated input signal asserted to the access node when the logic circuitry is coupled to the access node, and to generate the control signal in response to the input signal and assert said control sigal to the operational circuitry when the logic circuitry is coupled to the access node and to the operational circuitry, wherein the input signal has at least four levels, including a low level below a first threshold, a high level above a second threshold, an intermediate level between the first threshold and the second threshold, and a latch level above a third threshold, where the third threshold is greater than the second threshold, and wherein the logic circuitry includes:

first comparator circuitry, configured to be coupled to receive the input signal and to operate in a first mode in which said first comparator circuitry generates a first signal indicative of whether the input signal has a level less than the first threshold;

second comparator circuitry, configured to be coupled to receive the input signal and to operate in a first mode in which said second comparator circuitry generates a second signal indicative of whether the input signal has a level greater than the second threshold; and third comparator circuitry, coupled and configured to generate a latch signal indicative of whether the input signal has a level greater than the third threshold.

30. Test circuitry suitable for use in a circuit comprising an access node, and operational circuitry configured to operate in response to at least one control signal asserted to the access node, said test circuitry comprising:

logic circuitry configured to be coupled to the access node and to the operational circuitry; and additional circuitry coupled to the logic circuitry and configured to operate in at least one test mode in response to test data received at the access node, wherein the logic circuitry is configured to extract the test data from an amplitude-modulated input signal asserted to the access node when the logic circuitry is coupled to the access node, and to generate the control signal in response to the input signal and assert said control signal to the operational circuitry when the logic circuitry is coupled to the access node and to the operational circuitry, and wherein the additional circuitry includes:

a nonvolatile memory comprising at least one programmable cell having a first input coupled to receive a sequence of bits of the test data, and a second input coupled to receive a programming voltage, wherein the cell is operable in a mode in which the cell stores one of the bits of the test data being asserted at the first input while the programming voltage exceeds a programming level.

31. Test circuitry suitable for use in a circuit comprising an access node, and operational circuitry configured to operate in response to at least one control signal asserted to the access node, said test circuitry comprising:

logic circuitry configured to be coupled to the access node and to the operational circuitry; and additional circuitry coupled to the logic circuitry and configured to operate in at least one test mode in response to test data received at the access node, wherein the logic circuitry is configured to extract the test data from an amplitude-modulated input signal asserted to the access node when the logic circuitry is coupled to the access node, and to generate the control signal in response to the input signal and assert said control signal to the operational circuitry when the logic circuitry is coupled to the access node and to the operational circuitry, wherein the logic circuitry includes comparator circuitry coupled and configured to receive the input signal, to extract the test data from the input signal, and to extract a latch signal from the input signal, wherein the latch signal is indicative of whether the input signal has a level exceeding a latch threshold, and wherein the additional circuitry includes:

at least one register coupled to the comparator circuitry for receiving the latch signal and at least some of the test data;

a nonvolatile memory comprising at least one programmable cell having a first input coupled to receive a sequence of bits of the test data, and a second input coupled to receive a programming voltage, wherein the call is operable in a mode in which the cell stores one of the bits of the test data being asserted at the first input while the programming voltage exceeds a programming level; and a switch, coupled between the access node and the second input of the cell, wherein the switch has a closed state in which it passes the input signal to the second input of the cell, and wherein the input signal is said programming voltage.

32. A method for controlling operational circuitry within an integrated circuit, and performing at least one of testing, configuration, and reconfiguration of the operational circuitry, wherein the integrated circuit has an external node and the operational circuitry is configured to operate in response to at least one control signal, said method including the steps of:

operating test circuitry of the integrated circuit in at least one test mode in response to test data received at the external node from an external source; and asserting said at least one control signal from the test circuitry to the operational circuitry in response to an external control signal received at the external node, wherein the control signal has a state determined by the external control signal but not by the test data.

33. The method of claim 32, including the step of:

extracting the test data from an amplitude-modulated input signal asserted to the external node from the external source, and generating said at least one control signal in response to the input signal.

34. The method of claim 33, also including the step of:

extracting a clock signal from the input signal.

35. The method of claim 34, also including the step of:

operating the test circuitry in response to the clock signal during said at least one test mode.

36. The method of claim 33, wherein the input signal has at least three levels, including a low level below a first threshold, a high level above a second threshold, and an intermediate level between the first threshold and the second threshold, and the step of extracting the test data from the input signal includes the steps of:

generating a first signal indicative of whether the input signal has a level less than the first threshold;

generating a second signal indicative of whether the input signal has a level greater than the second threshold; and asserting the first signal to a reset terminal of a flip-flop and asserting the second signal to a set terminal of the flip-flop, thereby causing the flip-flop to assert a data signal indicative of the test data.

37. The method of claim 32, also including the step of:

during said at least one test mode, operating the test circuitry to assert data to the external node for transmission to external circuitry.

38. A method for controlling operational circuitry within an integrated circuit, and performing at least one of testing, configuration, and reconfiguration of the operational circuitry, wherein the integrated circuit has an external node and the operational circuitry is configured to operate in response to at least one control signal, said method including the steps of:

operating test circuitry of the integrated circuit in at least one test mode in response to test data received at the external node from an external source, wherein the test circuitry includes a nonvolatile memory comprising at least one programmable cell;

asserting said at least one control signal from the test circuitry to the operational circuitry in response to an external control signal received at the external node; and extracting the test data from an amplitude-modulated input signal asserted to the external node from the external source, and generating said at least one control signal in response to the input signal;

during each said test mode, generating a latch signal in response to determining that the input signal has a level above a latch threshold; and capturing a bit of the test data at said cell in response to the latch signal.

39. The method of claim 38, also including the step of:

after capturing the bit of the test data at said cell, asserting a voltage having a programming level to the cell, wherein the programming level is above the latch threshold, thereby storing said bit of the test data in the cell.

40. A method for controlling operational circuitry within an integrated circuit, and performing at least one of testing, configuration, and reconfiguration of the operational circuitry, wherein the integrated circuit has an external node and the operational circuitry is configured to operate in response to at least one control signal, said method including the steps of:

operating test circuitry of the integrated circuit in at least one test mode in response to test data received at the external node from an external source;

asserting said at least one control signal from the test circuitry to the operational circuitry in response to an external control signal received at the external node;

extracting the test data from an amplitude-modulated input signal assented to the external node from the external source; and when operating the test circuitry in each said test mode, terminating test mode operation of the test circuitry unless bits of the test data occur at the external node with frequency not less than a predetermined minimum frequency.

41. The method of claim 40, also including the step of:

generating said at least one control signal in response to the input signal.

42. A method for controlling operational circuitry within an integrated circuit, and performing at least one of testing, configuration, and reconfiguration of the operational circuitry, wherein the integrated circuit has an external node and the operational circuitry is configured to operate in response to at least one control signal, said method including the steps of:

operating test circuitry of the integrated circuit in at least one test mode in response to test data received at the external node from an external source;

asserting said at least one control signal from the test circuitry to the operational circuitry in response to an external control signal received at the external node;

extracting the test data from an input signal asserted to the external node from the external source; and analyzing the test data to determine whether said test data is indicative of a key, and commencing operation of the test circuitry in each said test mode only in response to determining that said test data is indicative of the key.

43. The method of claim 42, wherein the step of analyzing the test data to determine whether said test data is indicative of the key is performed by placing a state machine in a begin state in which the state machine is ready to analyze a bit of the test data to determine whether said bit is an element of the key, then operating the state machine in a decision state in which the state machine has received at least one bit of the test data but has not determined whether the test data is indicative of the key, and placing the state machine in a test-mode enable state when the state machine has received at least one bit of the test data and determined that the test data received thereby is indicative of the key, wherein the method also includes the step of:

placing the state machine in an error state when the state machine has received at least one bit of the test data and determined that the test data received thereby is not indicative of the digital key.

44. The method of claim 43, wherein the method includes the step of:

operating the state machine in the decision state for no more than a predetermined interval of time commencing on entry into said decision state, and causing the state machine to undergo a transition from the decision state to the error state if said state machine has not undergone a transition from the decision state to one of the test-mode enable state and the error state during said predetermined interval of time commencing on entry into the decision state.

\* \* \* \* \*